US008816683B2

(12) United States Patent
Wang et al.

(10) Patent No.: US 8,816,683 B2
(45) Date of Patent: Aug. 26, 2014

(54) MAGNETIC FIELD SENSING METHODS AND MEGNETIC FIELD SENSING APPARATUSES USING TUNNELING MAGNETO-RESISTOR DEVICES

(75) Inventors: Ding-Yeong Wang, Hsinchu County (TW); Young-Shying Chen, Hsinchu (TW); Keng-Ming Kuo, Yunlin County (TW)

(73) Assignee: Industrial Technology Research Institute, Hsinchu (TW)

( * ) Notice: Subject to any disclaimer, the term of this patent is extended or adjusted under 35 U.S.C. 154(b) by 220 days.

(21) Appl. No.: 13/548,440

(22) Filed: Jul. 13, 2012

(65) Prior Publication Data

US 2013/0229175 A1    Sep. 5, 2013

(30) Foreign Application Priority Data

Mar. 5, 2012  (TW) .............................. 101107276 A

(51) Int. Cl.
*G01R 33/02* (2006.01)
(52) U.S. Cl.
USPC ....... 324/252; 324/207.21; 324/260; 324/244
(58) Field of Classification Search
USPC ............ 324/248–255, 200, 378, 389, 207.21, 324/244; 702/116–117, 183, 189; 360/324, 360/324.1, 324.11, 324.12
See application file for complete search history.

(56) References Cited

U.S. PATENT DOCUMENTS

| 7,635,974 | B2 * | 12/2009 | Guo et al. ................. 324/207.21 |
| 7,965,077 | B2 * | 6/2011 | Engel et al. .................... 324/252 |
| 2005/0073878 | A1 | 4/2005 | Lin et al. |
| 2012/0068698 | A1 | 3/2012 | Chen et al. |

FOREIGN PATENT DOCUMENTS

| CN | 102047134 A | 5/2011 |
| JP | 2006-261400 A | 9/2006 |
| JP | 2010-145285 A | 7/2010 |
| TW | 201133015 A | 10/2011 |
| TW | 2011423360 A | 12/2011 |

OTHER PUBLICATIONS

Almeida, et al., "Field Detection in Single and Double Barrier MgO Magnetic Tunnel Junction Sensors", Journal of Applied Physics, 2008, vol. 103, 07E922-1 to 07E922-3.
Hansen, et al., "Theoretical Study of In-Plane Response of Magnetic Field Sensor to Magnetic Beads Magnetized by the Sensor Self-Field", Journal of Applied Physics, 2010, vol. 107, 124511-1 to 124511-9.

(Continued)

*Primary Examiner* — Melissa Koval
*Assistant Examiner* — Trung Nguyen
(74) *Attorney, Agent, or Firm* — Birch, Stewart, Kolasch & Birch, LLP

(57) ABSTRACT

Magnetic field sensing method and apparatus of this disclosure uses two tunneling magneto-resistor (TMR) devices. Angles of the free magnetizations of the two TMR devices with respect to a fixed direction are set in a first to fourth period. In the first to fourth period, the two TMR devices act as a TMR sensing unit and a zero-field reference unit by turns, and each of the conductance difference between the sensing unit and the zero field reference unit is also obtained in each of the first to fourth period. Finally, the four conductance differences are summed up.

19 Claims, 7 Drawing Sheets

(56) References Cited

OTHER PUBLICATIONS

Jang, et al., "Magnetic Field Sensing Scheme Using CoFeB/MgO/CoFeB Tunneling Junction With Superparamagnetic CoFeB Layer", Applied Physics Letters, 2006, vol. 89, 163119-1 to 163119-3.

Shah, et al., "Magnetic Tunneling Junction Based Magnetic Field Sensors: Role of Shape Anisotropy Versus Free Layer Thickness", Journal of Applied Physics, 2011, vol. 109, 07C731-1 to 07C731-3.

Zhao, et al., "Fabrication and Characterization of All-Thin-Film Magnetoelectric Sensors", Applied Physics Letters, 2009, vol. 94, 243507-1 to 243507-3.

Notice of Allowance issued on Jan. 7, 2014 for the corresponding Application No. 101107276 in Taiwan; pp. 1-4.

* cited by examiner

MAGNETIC FIELD SENSING METHODS AND MEGNETIC FIELD SENSING APPARATUSES USING TUNNELING MAGNETO-RESISTOR DEVICES

CROSS REFERENCE TO RELATED APPLICATIONS

The present application is based on, and claims priority from, Taiwan Application Serial Number 101107276, filed Mar. 5, 2012, the disclosure of which is hereby incorporated by reference herein in its entirety.

TECHNICAL FIELD

The technical field relates to magnetic field sensing, and in particular relates to magnetic field sensing methods and apparatuses using tunneling magneto-resistor devices.

BACKGROUND

The electronic compass has been integrated in various electronic products to improve performance. For example, the electronic compass can be used in the GPS to improve sensing ability. The heading direction in the GPS is determined by movement of object. However, when the object has low moving speed or even is in a static state, the GPS cannot precisely determine the orientation. The electronic compass can provide the information of the azimuth angle to indicate the direction.

The mechanism for sensing magnetic field has been proposed in various manners, such as typical Hall device or magneto-resistive devices. Magneto-resistive devices including anisotropic magneto-resistor (AMR), giant magneto-resistor (GMR) and tunneling magneto-resistor (TMR) have the benefits of larger sensitivity than Hall device, and the back-end process of the above described magneto-resistive devices can be easily integrated with the front-end process of CMOS.

A typical TMR for a magnetic field sensor 95 is shown in FIGS. 1A and 1B, including a bottom plate of conductive metal serving as a bottom electrode 102 formed on a substrate 90, a Magnetic Tunneling Junction (MTJ) device 110 formed on the bottom electrode 102, and a top plate of conductive material serving as a top electrode 106 formed on the MTJ device 110. From the structure pattern of a MTJ device, one can define a cross having intersection at the center of the MTJ device 110, the longer length is called as major axis 101 and the shorter length is called as minor axis 103, and also a line called easy-axis 180 is collinear with the major axis 101. The MTJ device 110 includes a pinned layer 112, a tunneling layer 115 and a free layer 116, in which the MTJ device 110 is sandwiched between the bottom electrode 102 and the top electrode 106. The pinned layer 112 is made of magnetic material formed on the bottom electrode 102 and has a first pinned magnetization 114 parallel to a pinned direction. The tunneling layer 115 of non-magnetic material is formed on the pinned layer 112. The free layer 116 of magnetic material is formed on the tunneling layer 115 and has a first free magnetization 118 which is initially parallel to the easy axis 180.

After the MTJ device is formed (i.e. completing magnetic thin film stacking and pattern etching), the pinned direction is set by applying a magnetic field perpendicular to the easy-axis 180 during an annealing process. After the annealing process, the pinned magnetization 114 will be parallel to the direction of the applied magnetic field, and the free magnetization 118 tends to be parallel to the easy-axis 180 due to the shape anisotropy of the MTJ device 110. Therefore, the magnetic field sensing direction of the TMR is perpendicular to the easy-axis 180 after the annealing process.

Through AMR or even GMR, it can achieve an integrated 2-axis magnetic field sensor, but the footprint sizes of them are quite large. Because of having very low resistivity, the device length has to be longer enough to a usable value for sensing magnetic field. FIGS. 2A and 2B are drawings, schematically illustrating a Wheatstone bridge circuit without and with shielding. As shown in FIG. 2A, the Wheatstone bridge circuit is a popular adopted method to transform the sensed magnetic field into an electronic signal. For the AMR magnetic sensor, each element R11, R21, R12, R22 of the bridge circuit is a series connection of several Barber pole biased AMRs and the shorting bar angles of adjacent elements are complementary, so that the bridge circuit is symmetric and full range operable. However, for the GMR or TMR magnetic field sensor, due to their symmetric magneto-resistance and magnetic field characteristics, two elements R21, R12 therefore must be shielded, as shown in FIG. 2B, and the bridge circuit only performs half range operation. For TMRs having high magneto-resistance ratio, the asymmetric half range operation of the bridge circuit results in losing linearity and accuracy to sense magnetic field by the bridge circuit.

U.S. patent application Ser. No. 13/097,083 entitled in "STRUCTURE OF TMR AND FABRICATION METHOD OF INTEGRATED 3-AXIS MAGNETIC HELD SENSOR AND SENSING CIRCUIT" discloses to magnetic field sensing devices having TMRs for sensing magnetic field. However, each X-axis sensor comprises two MTJ devices, each Y-axis sensor comprises two MTJ devices and each Z-axis sensor comprises four MTJ devices, based on FIGS. 6 and 9 in the US patent application. Further, two X-axis sensors, two Y-axis sensors or two Z-axis sensors are required to construct the magnetic field sensing device for magnetic field sensing, based on FIG. 12 in the US patent application. Therefore, the US patent application uses four MTJ devices for sensing magnetic field along the X-axis or Y-axis, and eight MTJ devices for sensing magnetic field along the Z-axis, thus increasing fabrication cost due to using too many MTJ devices, the mismatch between those MTJ devices may result in low yield.

SUMMARY

A first embodiment of the disclosure provides a magnetic field sensing method using tunneling magneto-resistor (TMR) sensors, comprising the following steps.

First, use a first TMR sensor and a second TMR sensor for sensing magnetic field; wherein the first TMR sensor and the second TMR sensor respectively comprise a first magnetic tunneling junction (MTJ) device and a second MTJ device, the first MTJ device and the second MTJ device having a pinned layer, a tunneling layer and a free layer, the pinned layers of the first and second MTJ device having a pinned magnetization at a first pinned direction and the first pinned direction having a first angle $\Phi$ to an easy-axis.

Secondly, provide a bias signal to the first and second TMR sensor.

Then, in a first period, perform a first sensing operation, comprising: setting a first free magnetization of the free layer of the first MTJ device to be parallel to the easy-axis and to have the first angle $\Phi$ to the first pinned direction, setting a second free magnetization of the free layer of the second MTJ device to have a second angle $\pi$-$\Phi$ to the first pinned direction, and pinning the first free magnetization. And, perform magnetic field sensing to obtain a first difference corresponding to conductance difference between the second TMR sensor and the first TMR sensor.

Then, in a second period, perform a second sensing operation, comprising: setting the first free magnetization of the free layer of the first MTJ device to be parallel to the easy-axis and to have the second angle $\pi$-$\Phi$ to the first pinned direction, setting the second free magnetization of the free layer of the second MTJ device to have the first angle $\Phi$ to the first pinned direction, and pinning the first free magnetization. And, perform magnetic field sensing to obtain a second difference corresponding to conductance difference between the second TMR sensor and the first TMR sensor.

Then, in a third period, perform a third sensing operation, comprising: setting the second free magnetization of the free layer of the second MTJ device to be parallel to the easy-axis and to have the first angle $\Phi$ to the first pinned direction, setting the first free magnetization of the free layer of the second MTJ device to have the second angle $\pi$-$\Phi$ to the first pinned direction, and pinning the second free magnetization. And, perform magnetic field sensing to obtain a third difference corresponding to conductance difference between the first TMR sensor and the second TMR sensor.

Then, in a fourth period, performing a fourth sensing operation, comprising: setting the second free magnetization of the free layer of the second MTJ device to be parallel to the easy-axis and to have the second angle $\pi$-$\Phi$ to the first pinned direction, setting the first free magnetization of the free layer of the first MTJ device to have the first angle $\Phi$ to the first pinned direction, and pinning the second free magnetization. And, perform magnetic field sensing to obtain a fourth difference corresponding to conductance difference between the first TMR sensor and the second TMR sensor.

Finally, sum the first to fourth differences to obtain a sensing value corresponding to magnetic field intensity.

According to the magnetic field sensing method as described in the first embodiment, the first TMR sensor and the second TMR sensor further respectively comprise a third magnetic tunneling junction (MTJ) device and a fourth MTJ device, the third MTJ device and the fourth MTJ device having a pinned layer, a tunneling layer and a free layer, the pinned layers of the third and fourth MTJ device having a pinned magnetization at a second pinned direction, the second and first pinned direction being symmetrical to the easy-axis and the second pinned direction having the first angle $\Phi$ to the easy-axis; and the third and fourth MTJ device respectively connected in parallel to the first and second MTJ device.

According to the magnetic field sensing method as described in the first embodiment, the first sensing operation further comprises: setting a third free magnetization of the free layer of the third MTJ device to be parallel to the easy-axis and to have the first angle $\Phi$ to the second pinned direction, setting a fourth free magnetization of the free layer of the fourth MTJ device to have the second angle $\pi$-$\Phi$ to the second pinned direction, and pinning the third free magnetization.

According to the magnetic field sensing method as described in the first embodiment, the second sensing operation further comprises: setting the third free magnetization of the free layer of the third MTJ device to be parallel to the easy-axis and to have the second angle $\pi$-$\Phi$ to the second pinned direction, setting the fourth free magnetization of the free layer of the fourth MTJ device to have the first angle $\Phi$ to the second pinned direction, and pinning the third free magnetization.

According to the magnetic field sensing method as described in the first embodiment, the third sensing operation further comprises: setting the fourth free magnetization of the free layer of the fourth MTJ device to be parallel to the easy-axis and to have the first angle $\Phi$ to the second pinned direction, setting the third free magnetization of the free layer of the third MTJ device to have the second angle $\pi$-$\Phi$ to the second pinned direction, and pinning the fourth free magnetization.

According to the magnetic field sensing method as described in the first embodiment, the fourth sensing operation further comprises: setting the fourth free magnetization of the free layer of the fourth MTJ device to be parallel to the easy-axis and to have the second angle $\pi$-$\Phi$ to the second pinned direction, setting the third free magnetization of the free layer of the third MTJ device to have the first angle $\Phi$ to the second pinned direction, and pinning the fourth free magnetization.

A second embodiment of the disclosure provides a magnetic field sensing method using tunneling magneto-resistor (TMR) sensors, comprising the following steps.

First, use a first TMR sensor and a second TMR sensor for sensing magnetic field; wherein the first TMR sensor and the second TMR sensor respectively comprise a first magnetic tunneling junction (MTJ) device and a second MTJ device, the first MTJ device and the second MTJ device respectively having a pinned layer, a tunneling layer and a free layer, the pinned layers of the first and second MTJ device having a pinned magnetization at a first pinned direction and the first pinned direction having a first angle $\Phi$ to an easy-axis.

Secondly, provide a bias signal to the first and second TMR sensor.

Then, in a first period, perform a first sensing operation, comprising: setting a first free magnetization of the free layer of the first MTJ device to be parallel to the easy-axis and to have the first angle $\Phi$ to the first pinned direction, setting a second free magnetization of the free layer of the second MTJ device to have the first angle $\Phi$ to the first pinned direction, and pinning the first free magnetization. And, perform magnetic field sensing to obtain a first difference corresponding to conductance difference between the second TMR sensor and the first TMR sensor.

Then, in a second period, perform a second sensing operation, comprising: setting the first free magnetization of the free layer of the first MTJ device to be parallel to the easy-axis and to have a second angle $\pi$-$\Phi$ to the first pinned direction, setting the second free magnetization of the free layer of the second MTJ device to have the second angle $\pi$-$\Phi$ to the first pinned direction, and pinning the first free magnetization. And, perform magnetic field sensing to obtain a second difference corresponding to conductance difference between the second TMR sensor and the first TMR sensor.

Then, in a third period, perform a third sensing operation, comprising: setting the second free magnetization of the free layer of the second MTJ device to be parallel to the easy-axis and to have the first angle $\Phi$ to the first pinned direction, setting the first free magnetization of the free layer of the second MTJ device to have the first angle $\Phi$ to the first pinned direction, and pinning the second free magnetization. And, perform magnetic field sensing to obtain a third difference corresponding to conductance difference between the first TMR sensor and the second TMR sensor.

Then, in a fourth period, perform a fourth sensing operation, comprising: setting the second free magnetization of the free layer of the second MTJ device to be parallel to the easy-axis and to have the second angle $\pi$-$\Phi$ to the first pinned direction, setting the first free magnetization of the free layer of the first MTJ device to have the second angle $\pi$-$\Phi$ to the first pinned direction, and pinning the second free magnetization. And, perform magnetic field sensing to obtain a fourth difference corresponding to conductance difference between the first TMR sensor and the second TMR sensor.

Finally, sum the first to fourth differences to obtain a sensing value corresponding to magnetic field intensity.

According to the magnetic field sensing method as described in the second embodiment, the first TMR sensor and the second TMR sensor further respectively comprise a third magnetic tunneling junction (MTJ) device and a fourth MTJ device, the third MTJ device and the fourth MTJ device respectively having a pinned layer, a tunneling layer and a free layer, the pinned layers of the third and fourth MTJ device having a pinned magnetization at a second pinned direction, the second and first pinned direction being symmetrical to the easy-axis and the second pinned direction having the first angle $\Phi$ to the easy-axis; and the third and fourth MTJ device respectively connected in parallel to the first and second MTJ device.

According to the magnetic field sensing method as described in the second embodiment, the first sensing operation further comprises: setting a third free magnetization of the free layer of the third MTJ device to be parallel to the easy-axis and to have the first angle $\Phi$ to the second pinned direction, setting a fourth free magnetization of the free layer of the fourth MTJ device to have the first angle $\Phi$ to the second pinned direction, and pinning the third free magnetization.

According to the magnetic field sensing method as described in the second embodiment, the second sensing operation further comprises: setting the third free magnetization of the free layer of the third MTJ device to be parallel to the easy-axis and to have the second angle $\pi-\Phi$ to the second pinned direction, setting the fourth free magnetization of the free layer of the fourth MTJ device to have the second angle $\pi-\Phi$ to the second pinned direction, and pinning the third free magnetization.

According to the magnetic field sensing method as described in the second embodiment, the third sensing operation further comprises: setting the fourth free magnetization of the free layer of the fourth MTJ device to be parallel to the easy-axis and to have the first angle $\Phi$ to the second pinned direction, setting the third free magnetization of the free layer of the third MTJ device to have the first angle $\Phi$ to the second pinned direction, and pinning the fourth free magnetization.

According to the magnetic field sensing method as described in the second embodiment, the fourth sensing operation further comprises: setting the fourth free magnetization of the free layer of the fourth MTJ device to be parallel to the easy-axis and to have the second angle $\pi-\Phi$ to the second pinned direction, setting the third free magnetization of the free layer of the third MTJ device to have the second angle $\pi-\Phi$ to the second pinned direction, and pinning the fourth free magnetization.

A third embodiment of the disclosure provides a magnetic field sensing apparatus comprises: a voltage-clamping current mirror unit, a first tunneling magneto-resistor (TMR) sensor and a second TMR sensor, a control unit, a transform unit and a sum unit.

The voltage-clamping current mirror unit has an input terminal, a first output terminal and a second output terminal, the first and second output terminals respectively providing a first and second fixed voltage of equal level according to a bias voltage received by the input terminal.

The first tunneling magneto-resistor (TMR) sensor and the second TMR sensor are directly or indirectly connected to the first output terminal and the second output terminal; wherein the first TMR sensor and the second TMR sensor respectively comprise a first magnetic tunneling junction (MTJ) device and a second MTJ device, the first MTJ device and the second MTJ device respectively having a pinned layer, a tunneling layer and a free layer, the pinned layers of the first and second MTJ device having a pinned magnetization at a first pinned direction and the first pinned direction having a first angle $\pi-\Phi$ to an easy-axis.

The control unit, in a first period to a fourth period, respectively sets angle configuration of a first free magnetization of the free layer of the first MTJ device and a second free magnetization of the free layer of the second MTJ device with respect to the first pinned direction.

The transform unit, in the first period to the fourth period when the magnetic field apparatus senses a magnetic field, respectively transforms a first difference to a fourth difference corresponding to conductance differences between the first TMR sensor and the second TMR sensor to a first electronic signal to a fourth electronic signal.

The sum unit sums the first to fourth electronic signal to obtain a result electronic signal corresponding to intensity of the magnetic field.

According to the magnetic field sensing apparatus as described in the third embodiment, the control unit may set the configuration, in the first to fourth period, based on a first way or a second way. Based on the first way, in the first period, the control unit sets a first free magnetization of the free layer of the first MTJ device to be parallel to the easy-axis and to have the first angle $\Phi$ to the first pinned direction, setting a second free magnetization of the free layer of the second MTJ device to have a second angle $\pi-\Phi$ to the first pinned direction, and pinning the first free magnetization. In the second period, the control unit sets the first free magnetization of the free layer of the first MTJ device to be parallel to the easy-axis and to have the second angle $\pi-\Phi$ to the first pinned direction, setting the second free magnetization of the free layer of the second MTJ device to have the first angle $\Phi$ to the first pinned direction, and pinning the first free magnetization. In the third period, the control unit sets the second free magnetization of the free layer of the second MTJ device to be parallel to the easy-axis and to have the first angle $\Phi$ to the first pinned direction, setting the first free magnetization of the free layer of the second MTJ device to have the second angle $\pi-\Phi$ to the first pinned direction, and pinning the second free magnetization. In the fourth period, setting the second free magnetization of the free layer of the second MTJ device to be parallel to the easy-axis and to have the second angle $\pi-\Phi$ to the first pinned direction, setting the first free magnetization of the free layer of the first MTJ device to have the first angle $\Phi$ to the first pinned direction, and pinning the second free magnetization.

Based on the second way, in the first period, the control unit sets a first free magnetization of the free layer of the first MTJ device to be parallel to the easy-axis and to have the first angle $\Phi$ to the first pinned direction, setting a second free magnetization of the free layer of the second MTJ device to have the first angle $\Phi$ to the first pinned direction, and pinning the first free magnetization. In the second period, the control unit sets the first free magnetization of the free layer of the first MTJ device to be parallel to the easy-axis and to have a second angle $\pi-\Phi$ to the first pinned direction, setting the second free magnetization of the free layer of the second MTJ device to have the second angle $\pi-\Phi$ to the first pinned direction, and pinning the first free magnetization. In the third period, the control unit sets the second free magnetization of the free layer of the second MTJ device to be parallel to the easy-axis and to have the first angle $\Phi$ to the first pinned direction, setting the first free magnetization of the free layer of the second MTJ device to have the first angle Φ to the first pinned direction, and pinning the second free magnetization. In the fourth period, the control unit sets the second free magnetization of the free layer of the second MTJ device to be parallel to the easy-axis and to have the second angle π-Φ to the first pinned direction, setting the first free magnetization of the free layer of the first MTJ device to have the second angle π-Φ to the first pinned direction, and pinning the second free magnetization.

In the magnetic field sensing apparatus described above, the first TMR sensor and the second TMR sensor further respectively comprise a third magnetic tunneling junction (MTJ) device and a fourth MTJ device, the third MTJ device and the fourth MTJ device having a pinned layer, a tunneling layer and a free layer, the pinned layers of the third and fourth MTJ device having a pinned magnetization at a second pinned direction, the second and first pinned direction being symmetrical to the easy-axis and the second pinned direction having the first angle Φ to the easy-axis; and the third and fourth MTJ device respectively connected in parallel to the first and second MTJ device.

The magnetic field sensing apparatus has the first to fourth MTJ device. The control unit of the magnetic field sensing apparatus sets the angle configuration based on the first way further comprising: in the first period, the control unit setting a third free magnetization of the free layer of the third MTJ device to be parallel to the easy-axis and to have the first angle Φ to the second pinned direction, setting a fourth free magnetization of the free layer of the fourth MTJ device to have the second angle π-Φ to the second pinned direction, and pinning the third free magnetization; in the second period, the control unit setting the third free magnetization of the free layer of the third MTJ device to be parallel to the easy-axis and to have the second angle π-Φ to the second pinned direction, setting the fourth free magnetization of the free layer of the fourth MTJ device to have the first angle Φ to the second pinned direction, and pinning the third free magnetization; in the third period, the control unit setting the fourth free magnetization of the free layer of the fourth MTJ device to be parallel to the easy-axis and to have the first angle Φ to the second pinned direction, setting the third free magnetization of the free layer of the third MTJ device to have the second angle π-Φ to the second pinned direction, and pinning the fourth free magnetization; in the fourth period, the control unit setting the fourth free magnetization of the free layer of the fourth MTJ device to be parallel to the easy-axis and to have the second angle π-Φ to the second pinned direction, setting the third free magnetization of the free layer of the third MTJ device to have the first angle Φ to the second pinned direction, and pinning the fourth free magnetization.

The magnetic field sensing apparatus has the first to fourth MTJ device. The control unit of the magnetic field sensing apparatus sets the angle configuration based on the second way further comprising: in the first period, the control unit setting a third free magnetization of the free layer of the third MTJ device to be parallel to the easy-axis and to have the first angle Φ to the second pinned direction, setting a fourth free magnetization of the free layer of the fourth MTJ device to have the first angle Φ to the second pinned direction, and pinning the third free magnetization; in the second period, the control unit setting the third free magnetization of the free layer of the third MTJ device to be parallel to the easy-axis and to have the second angle π-Φ to the second pinned direction, setting the fourth free magnetization of the free layer of the fourth MTJ device to have the second angle π-Φ to the second pinned direction, and pinning the third free magnetization; in the third period, the control unit setting the fourth free magnetization of the free layer of the fourth MTJ device to be parallel to the easy-axis and to have the first angle Φ to the second pinned direction, setting the third free magnetization of the free layer of the third MTJ device to have the first angle Φ to the second pinned direction, and pinning the fourth free magnetization; in the fourth period, the control unit setting the fourth free magnetization of the free layer of the fourth MTJ device to be parallel to the easy-axis and to have the second angle π-Φ to the second pinned direction, setting the third free magnetization of the free layer of the third MTJ device to have the second angle π-Φ to the second pinned direction, and pinning the fourth free magnetization.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1A:
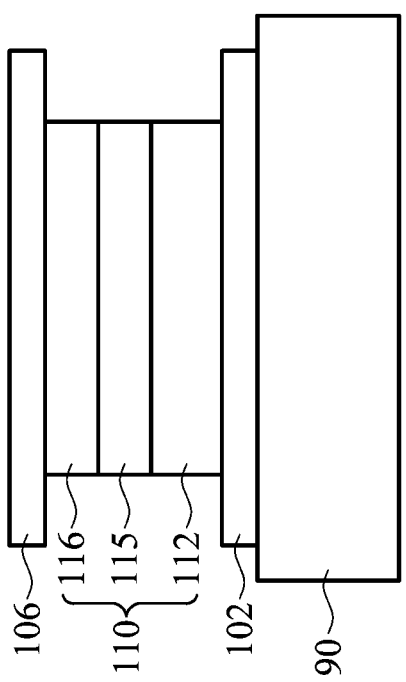
FIGS. 1A and 1B schematically show a typical TMR for a magnetic field sensor.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout

EXAMPLES

Tunneling magneto-resistors serve as magnetic field sensors in the disclosure, and are referred to as TMR sensors hereinafter.

Figure 1B:
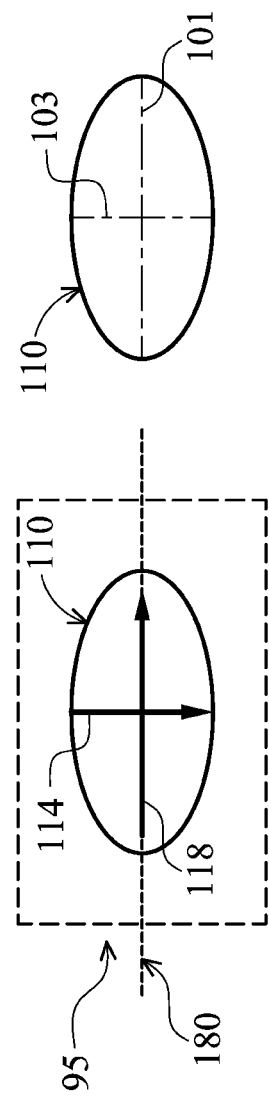
Figure 2B:
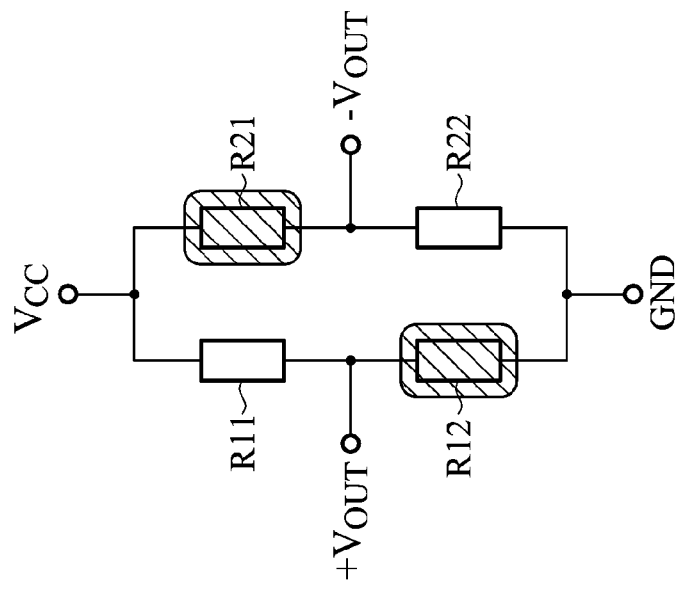
FIGS. 2A and 2B are drawings, schematically illustrating a Wheatstone bridge circuit without and with shielding.
Figure 2A:
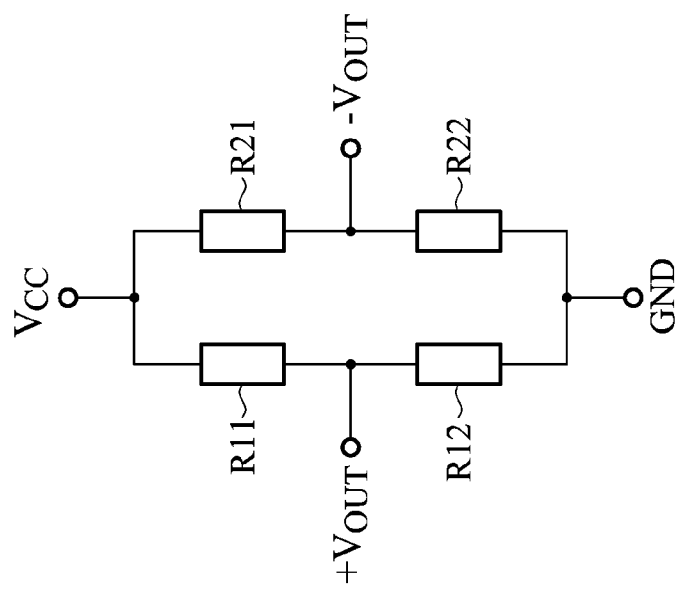
Figure 3:
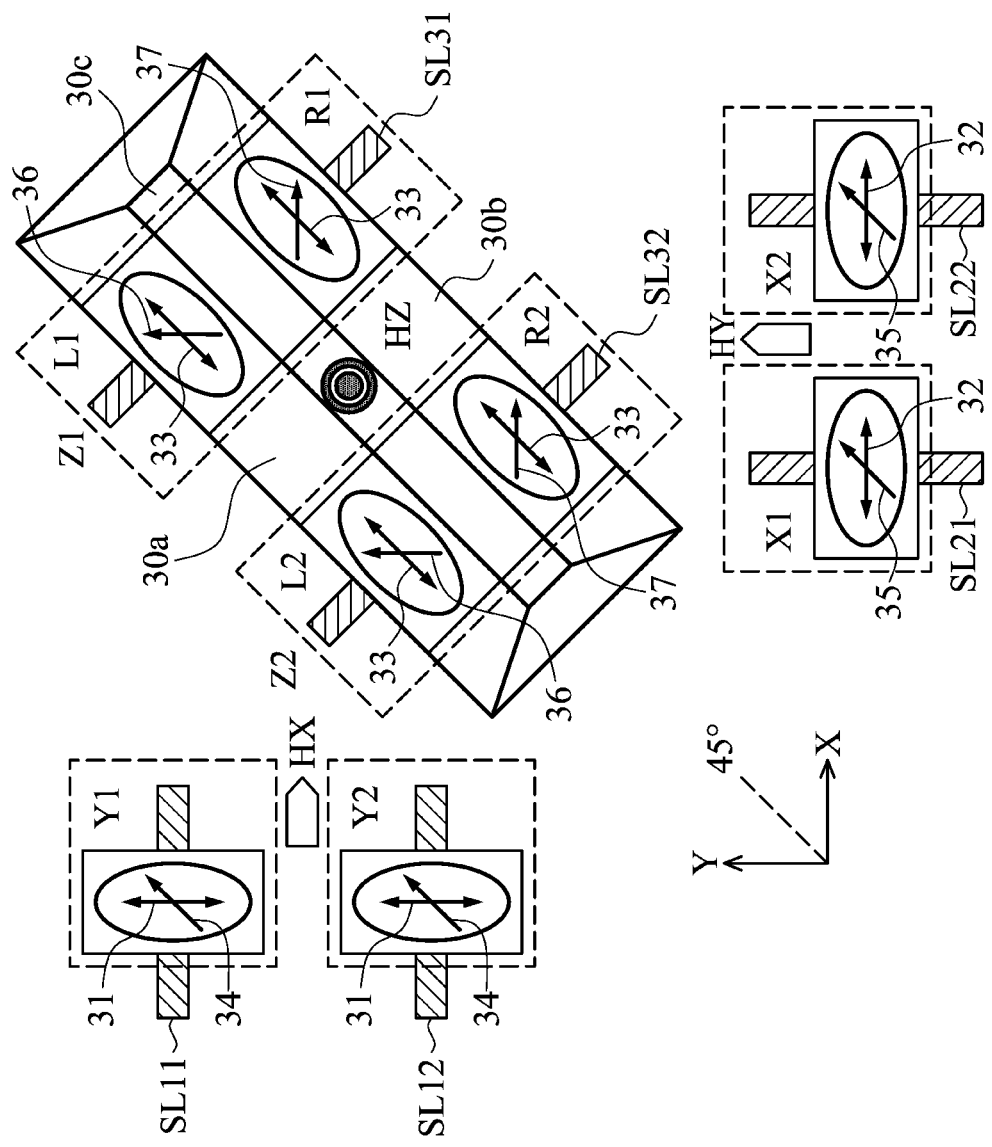
FIG. 3 shows a corresponding arrangement of the TMR sensors in X-axis, Y-axis and Z-axis for magnetic field sensing.

FIG. 3 shows a corresponding arrangement of the TMR sensors in X-axis, Y-axis and Z-axis for magnetic field sensing. The TMR sensors made of tunneling magneto-resistors at least have the structure of the magnetic tunneling junction (MTJ) device as described in FIGS. 1A and 1B.

Referring to FIG. 3, each of X-axis sensors Y1 and Y2 comprises a TMR sensor made of a MTJ device, each of Y-axis sensors X1 and X2 comprises a TMR sensor made of a MTJ device. A Z-axis sensor Z1 comprises two TMR sensors made of two MTJ devices L1 and R1, and a Z-axis sensor Z2 comprises two TMR sensors made of two MTJ devices L2 and R2. Pinned magnetizations 34 of the X-axis sensors (Y1, Y2) and pinned magnetizations 35 of the Y-axis sensors (X1, X2) are at a same pinned direction. The pinned direction as depicted in FIG. 3 has an angle of 45 degrees to the X-axis and Y-axis, for example.

The MTJ devices (L1, R1) of the Z-axis sensor Z1 are connected in parallel, and the MTJ devices (L2, R2) of the Z-axis sensor Z2 are connected in parallel. The MTJ devices (L1, R1) are provided on a first inclined plane 30a, and the MTJ devices (L2, R2) are provided on a second inclined plane 30b. The first and second inclined planes (30a, 30b) have a same inclined angle to a substrate. The substrate has a convex or concave structure (30c) where the first and second inclined planes (30a, 30b) provided thereon. The pinned magnetizations 36 of the MTJ devices (L1, L2) and the pinned magnetizations 37 of the MTJ devices (R1, R2) are symmetrically flipped with respect to the a central axis of the convex or concave structure 30c.

The X-axis sensors (Y1, Y2) are arranged such that the easy-axes thereof are parallel to the Y-axis. The free magnetizations 31 of the X-axis sensors (Y1, Y2) initially are set to be parallel to the Y-axis for sensing a magnetic field ($H_X$) along the X-axis. The Y-axis sensors (X1, X2) are arranged such that the easy-axes thereof are parallel to the X-axis. The free magnetizations 32 of the X-axis sensors (X1, X2) initially are set to be parallel to the X-axis for sensing a magnetic field ($H_Y$) along the Y-axis.

The MTJ devices L1~L2 and R1~R2 of the Z-axis sensors (Z1, Z2) are arranged such that the easy-axes thereof have an angle of 45 degrees to the Y-axis (or X-axis), for example. The free magnetizations 33 of the Z-axis sensors (Z1, Z2) initially are set to be parallel to the easy-axis of the MTJ devices (L1~L2, R1~R2), i.e., having the angle of 45 degrees to the X-axis or Y-axis, for sensing a magnetic field ($H_Z$) along the Z-axis.

Referring to FIG. 3, metal line paths SL11~SL12, SL21~SL22 and SL31~SL32 respectively cross the X-axis sensors Y1~Y2, the Y-axis sensors X1~X2 and the Z-axis sensors Z1~Z2, for setting directions of free magnetizations of the X-axis, Y-axis and Z-axis sensors by applying setting currents thereto.

The structure and operation of the X-axis sensors and the Y-axis sensors are similar, thus using the X-axis sensors Y1 and Y2 to describe the magnetic field sensing method of the disclosure. In this example, the pinned direction of the pinned layer in each of the X-axis sensors has an angle of $\pi/4$ to the Y-axis. The conductance of the X-axis sensors Y1 and Y2 is notified by $G_Q^P$. When the superscript P is Y10 (Y20), the conductance $G^{Y10}$ ($G^{Y20}$) is the conductance of the X-axis sensor Y1 (Y2) in which the free magnetization of the free layer of the Y1 sensor (Y2 sensor) is at the major axis (easy-axis). When the superscript P is Y1 (Y2), the conductance $G^{Y1}$ ($G^{Y2}$) is the conductance of the X-axis sensor Y1 (Y2) corresponding to the sensed magnetic field $H_X$ along the X-axis. The subscript Q marks the angle between the free magnetization and the pinned magnetization of the X-axis sensor Y1 (Y2). Therefore, the conductance of the X-axis sensor Y1 is represented by the equations (1) and (2) as follows:

$$G_{\frac{\pi}{4}}^{Y1} = \frac{G_P}{2}\left[1 + \frac{1 + \frac{MR}{\sqrt{2}}(\cos\theta - \sin\theta)}{1 + MR}\right]$$ equation (1)

$$G_{\frac{3\pi}{4}}^{Y1} = \frac{G_P}{2}\left[1 + \frac{1 + \frac{MR}{\sqrt{2}}(-\cos\theta - \sin\theta)}{1 + MR}\right].$$ equation (2)

Where MR is magneto-resistance ratio, $G_P$ is the conductance when the free magnetization is parallel to the pinned magnetization, and $\theta$ is the angle between the free magnetization and the easy-axis when the magnetic field is perpendicular to the easy-axis.

The free magnetization can be pinned at the direction of the major axis (easy-axis) by applying setting current, and the X-axis sensor Y1 serves as zero-field reference unit with conductance not responding to the magnetic field. The conductance is represented by the equations (3) and (4) as follows:

$$G_{\frac{\pi}{4}}^{Y10} = \frac{G_P}{2}\left[1 + \frac{1 + \frac{MR}{\sqrt{2}}}{1 + MR}\right]$$ equation (3)

$$G_{\frac{3\pi}{4}}^{Y10} = \frac{G_P}{2}\left[1 + \frac{1 - \frac{MR}{\sqrt{2}}}{1 + MR}\right].$$ equation (4)

The conductance variations of the two X-axis sensors Y1 and Y2, responding to the sensed magnetic field, are shown in equations (5) and (6) as follows:

$$\Delta G^{Y1} = \left(G_{\frac{\pi}{4}}^{Y1} + G_{\frac{3\pi}{4}}^{Y1} - G_{\frac{\pi}{4}}^{Y10} - G_{\frac{3\pi}{4}}^{Y10}\right)$$ equation (5)
$$= \left(G_P\left[\frac{MR}{1+MR}\right]\right) * \frac{(-\sin\theta)}{\sqrt{2}}$$
$$= \left(G_P\left[\frac{MR}{1+MR}\right]\right) * \frac{(-H_x)}{\sqrt{2}\,H_c}$$

$$\Delta G^{Y2} = \left(G_{\frac{\pi}{4}}^{Y2} + G_{\frac{3\pi}{4}}^{Y2} - G_{\frac{\pi}{4}}^{Y20} - G_{\frac{3\pi}{4}}^{Y20}\right)$$ equation (6)
$$= \left(G_P\left[\frac{MR}{1+MR}\right]\right) * \frac{(-\sin\theta)}{\sqrt{2}}$$
$$= \left(G_P\left[\frac{MR}{1+MR}\right]\right) * \frac{(-H_x)}{\sqrt{2}\,H_c}.$$

The summation of conductance variations of the two X-axis sensors Y1 and Y2, responding to the sensed magnetic field, are shown in equation (7) as follows:

$$\Delta G^{Y1} + \Delta G^{Y2} = \left(2G_P\left[\frac{MR}{1+MR}\right]\right) * \frac{(-H_x)}{\sqrt{2}\,H_c}$$ equation (7)
$$= \left(G_{\frac{3\pi}{4}}^{Y2} - G_{\frac{\pi}{4}}^{Y10}\right) + \left(G_{\frac{\pi}{4}}^{Y2} - G_{\frac{3\pi}{4}}^{Y10}\right) +$$
$$\left(G_{\frac{3\pi}{4}}^{Y1} - G_{\frac{\pi}{4}}^{Y20}\right) + \left(G_{\frac{\pi}{4}}^{Y1} - G_{\frac{3\pi}{4}}^{Y20}\right).$$

Where $H_X$ represents the magnetic field applied along the X-axis and HC is coercivity of the MTJ device.

The summation $\Delta G^{Y1} + \Delta G^{Y2}$ in the equation (7) can be respectively obtained in four periods. In the four periods, the X-axis sensors Y1 and Y2 alternately serve as a sensing unit and a zero-field reference unit, for sensing magnetic field. Equation (8), shown as follows, is equivalent to the equation (7) and available for sensing magnetic field.

$$\Delta G^{Y1} + \Delta G^{Y2} = \left(2G_P\left[\frac{MR}{1+MR}\right]\right) * \frac{(-H_x)}{\sqrt{2}\,H_c} \quad \text{equation (8)}$$

$$= \left(G^{Y2}_{\frac{\pi}{4}} - G^{Y10}_{\frac{\pi}{4}}\right) + \left(G^{Y2}_{\frac{3\pi}{4}} - G^{Y10}_{\frac{3\pi}{4}}\right) +$$

$$\left(G^{Y1}_{\frac{\pi}{4}} - G^{Y20}_{\frac{\pi}{4}}\right) + \left(G^{Y1}_{\frac{3\pi}{4}} - G^{Y20}_{\frac{3\pi}{4}}\right).$$

A first and second embodiment according to magnetic field sensing methods of the disclosure will be described in detailed hereinafter, by taking the X-axis sensors Y1 and Y2 for example.

First Embodiment of a Magnetic Field Sensing Method

A magnetic field sensing method according to a first embodiment of the disclosure comprises: providing a fixed or direct-current bias signal to the X-axis sensors Y1~Y2; in a first period to a fourth period (T1~T4), respectively performing a first, second, third and fourth sensing operation to respectively set configurations of the free magnetizations of the X-axis sensors Y1~Y2 and obtain a first, second, third and fourth difference corresponding to the conductance differences between the X-axis sensors Y1 and Y2; and summing the first to fourth differences to obtain a sensing value corresponding to magnetic field intensity.

Figure 4A:
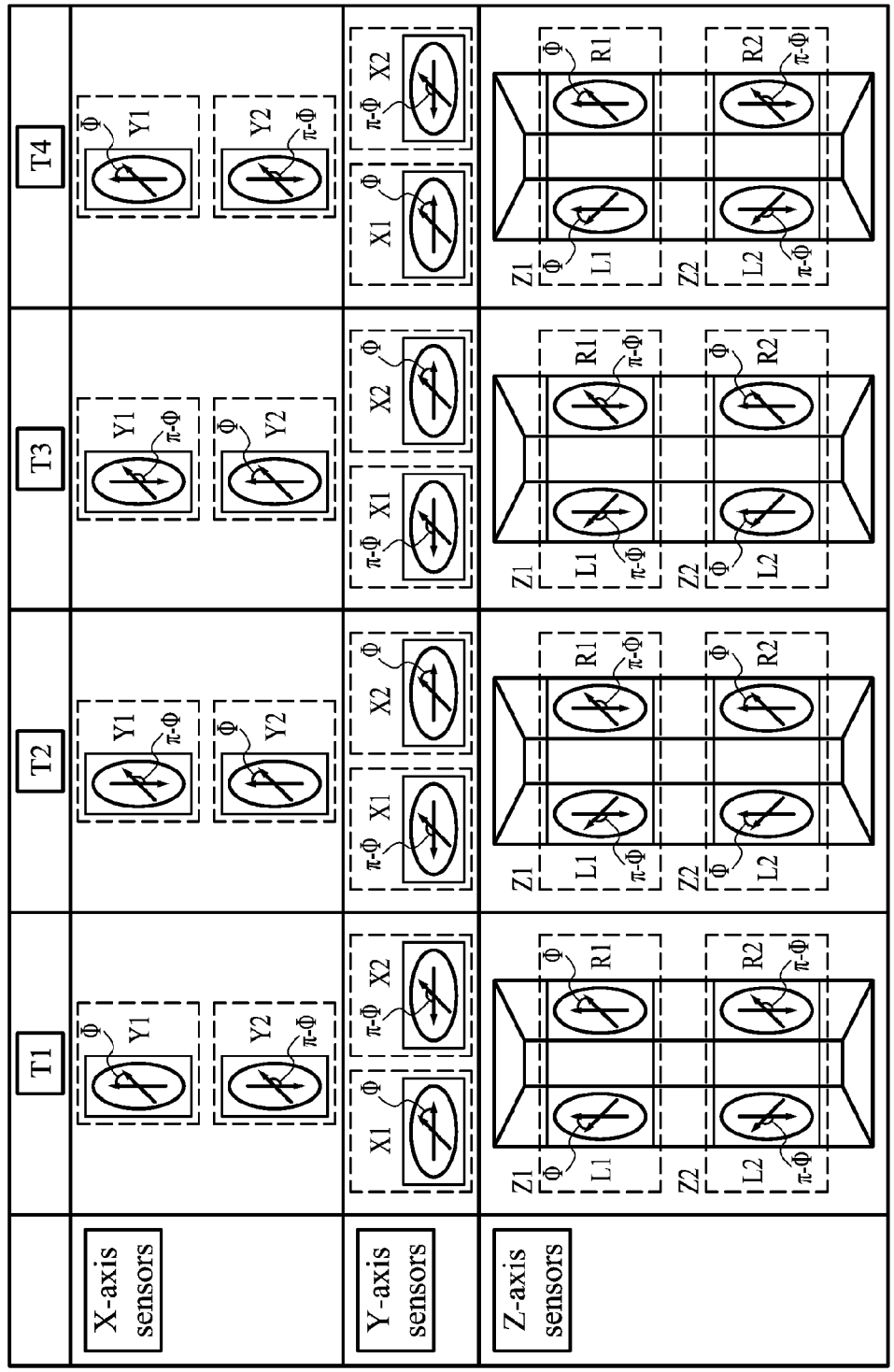
FIGS. 4A and 4B show angle configurations of the free magnetizations of the X-axis, Y-axis and Z-axis sensors, in the first to fourth period.

FIG. 4A shows configurations of the free magnetizations of the X-axis, Y-axis and Z-axis sensors. The first to fourth sensing operations are described by referencing the free magnetization configurations of the X-axis sensors.

In the first period T1, the first sensing operation comprises: setting a first free magnetization of the free layer of the X-axis sensor Y1 to be parallel to the easy-axis (long-axis) and to have the first angle Φ (here π/4, for example) to the first pinned direction (pinned magnetization), setting a second free magnetization of the free layer of the X-axis sensor Y2 to have a second angle π-Φ (here 3π/4, for example) to the first pinned direction, and pinning the first free magnetization, i.e., the X-axis sensor Y1 serving as a zero-field reference unit. After setting the free magnetizations, the configuration is shown in the first period T1 in FIG. 4A. Further perform magnetic field sensing to obtain a first difference $$\left(G^{Y2}_{\frac{3\pi}{4}} - G^{Y10}_{\frac{\pi}{4}}\right)$$

corresponding to conductance difference between the X-axis sensors Y1 and Y2.

In the second period T2, the second sensing operation comprises: setting the first free magnetization of the free layer of the X-axis sensor Y1 to be parallel to the easy-axis and to have the second angle π-Φ (=3π/4) to the first pinned direction, setting the second free magnetization of the free layer of the X-axis sensor Y2 to have the first angle Φ (=π/4) to the first pinned direction, and pinning the first free magnetization; the X-axis sensor Y1 still serving as the zero-field reference unit. After setting the free magnetization, the configuration is shown in the second period T2 in FIG. 4A. Further perform magnetic field sensing to obtain a second difference $$\left(G^{Y2}_{\frac{\pi}{4}} - G^{Y10}_{\frac{3\pi}{4}}\right)$$

corresponding to conductance difference between the X-axis sensors Y1 and Y2.

In the third period T3, the third sensing operation comprises: setting the second free magnetization of the free layer of the X-axis sensor Y2 to be parallel to the easy-axis and to have the first angle Φ (=π/4) to the first pinned direction, setting the first free magnetization of the free layer of the X-axis sensor Y1 to have the second angle π-Φ (=3π/4) to the first pinned direction, and pinning the second free magnetization; i.e., the X-axis sensor Y2 serving as the zero-field reference unit. After setting the free magnetization, the configuration is shown in the third period T3 in FIG. 4A. Further perform magnetic field sensing to obtain a third difference $$\left(G^{Y1}_{\frac{3\pi}{4}} - G^{Y20}_{\frac{\pi}{4}}\right)$$

corresponding to conductance difference between the X-axis sensors Y1 and Y2.

In the fourth period T4, the fourth sensing operation comprises: setting the second free magnetization of the free layer of the X-axis sensor Y2 to be parallel to the easy-axis and to have the second angle π-Φ (=3π/4) to the first pinned direction, setting the first free magnetization of the free layer of the X-axis sensor Y1 to have the first angle Φ (=π/4) to the first pinned direction, and pinning the second free magnetization; the X-axis sensor Y2 still serving as a zero-field reference unit. After setting the free magnetization, the configuration is shown in the fourth period T4 in FIG. 4A. Further perform magnetic field sensing to obtain a fourth difference $$\left(G^{Y1}_{\frac{\pi}{4}} - G^{Y20}_{\frac{3\pi}{4}}\right)$$

corresponding to conductance difference between the X-axis sensors Y1 and Y2.

In addition, a magnetic field sensing method according to a second embodiment of the disclosure, by and large, comprises similar steps with that of the first embodiment. The differences between the second and first embodiments are in the first to fourth sensing operations respectively performed in the first to fourth periods. The first to fourth sensing operations of the second embodiment will be described as follows.

Second Embodiment of a Magnetic Field Sensing Method

Figure 4B:
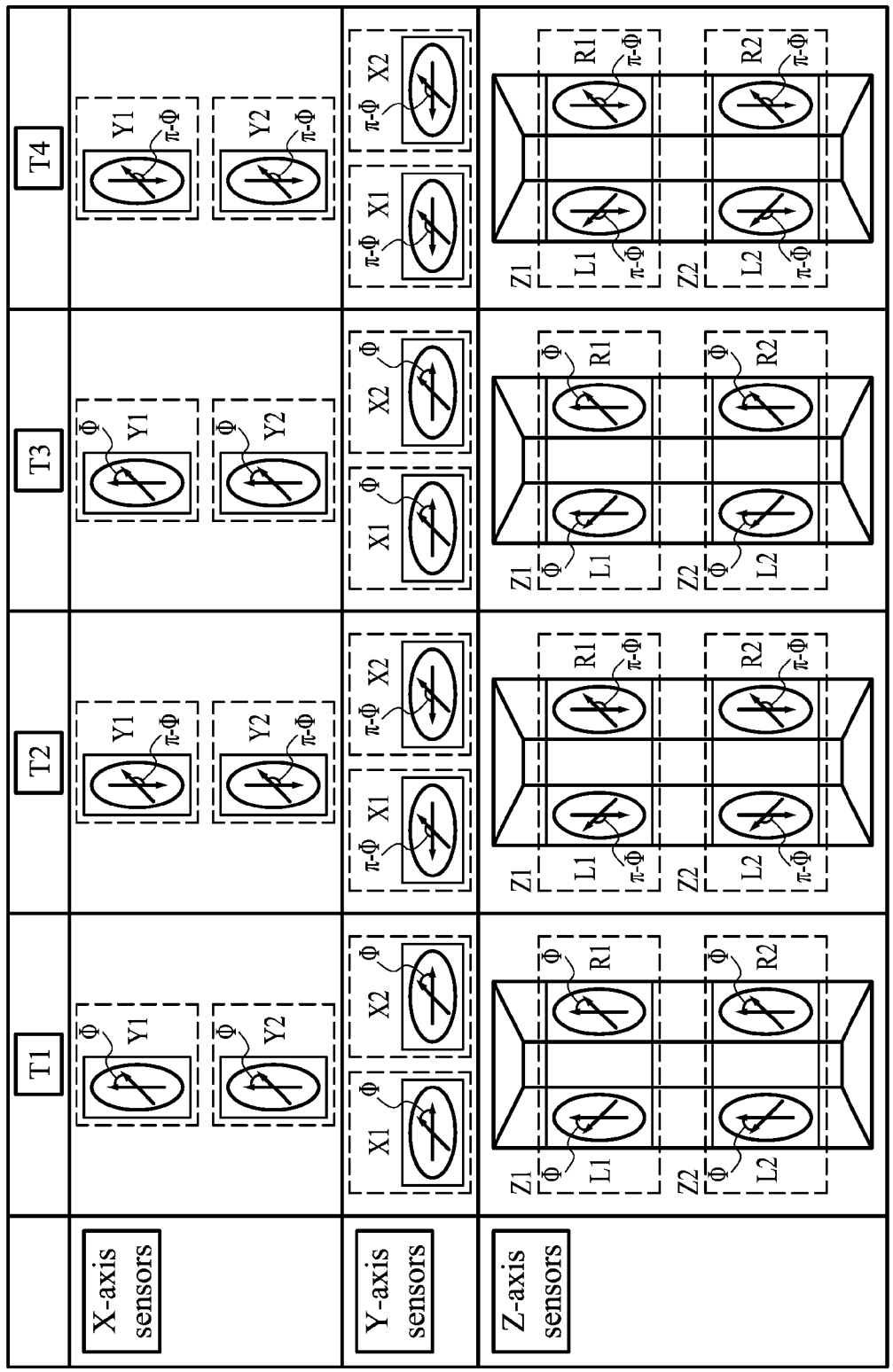

The first to fourth sensing operations of the second embodiment are described by referencing the free magnetization configurations of the X-axis sensors in FIG. 4B.

In a first period T1, the first sensing operation, comprises: setting a first free magnetization of the free layer of the X-axis sensor Y1 to be parallel to the easy-axis and to have the first angle Φ (here π/4, for example) to the first pinned direction, setting a second free magnetization of the free layer of the X-axis Y2 to have the first angle Φ (=π/4) to the first pinned direction, and pinning the first free magnetization; i.e., the X-axis sensor Y1 serving as a zero-field reference unit. After setting the free magnetizations, the configuration is shown in the first period T1 in FIG. 4B. Further perform magnetic field sensing to obtain a first difference $$\left(G^{Y2}_{\frac{\pi}{4}} - G^{Y10}_{\frac{\pi}{4}}\right)$$

corresponding to conductance difference between the X-axis sensors Y2 and Y1.

In the second period T2, the second sensing operation, comprises: setting the first free magnetization of the free layer of the X-axis sensor Y1 to be parallel to the easy-axis and to have a second angle π-Φ (=3π/4) to the first pinned direction, setting the second free magnetization of the free layer of the X-axis sensor Y2 to have the second angle π-Φ (=3π/4) to the first pinned direction, and pinning the first free magnetization; the X-axis sensor Y1 still serving as the zero-field reference unit. After setting the free magnetizations, the configuration is shown in the second period T2 in FIG. 4B. Further perform magnetic field sensing to obtain a second difference $$\left(G^{Y2}_{\frac{3\pi}{4}} - G^{Y10}_{\frac{3\pi}{4}}\right)$$

corresponding to conductance difference between the X-axis sensors Y2 and Y1.

In the third period T3, the third sensing operation comprises: setting the second free magnetization of the free layer of the X-axis sensor Y2 to be parallel to the easy-axis and to have the first angle Φ (=π/4) to the first pinned direction, setting the first free magnetization of the free layer of the X-axis sensor Y1 to have the first angle Φ (=π/4) to the first pinned direction, and pinning the second free magnetization; i.e., the X-axis sensor Y2 serving as the zero-field reference unit. After setting the free magnetizations, the configuration is shown in the third period T3 in FIG. 4B. Further perform magnetic field sensing to obtain a third difference $$\left(G^{Y1}_{\frac{\pi}{4}} - G^{Y20}_{\frac{\pi}{4}}\right)$$

corresponding to conductance difference between the X-axis sensors Y1 and Y2.

In the fourth period T4, the fourth sensing operation comprises: setting the second free magnetization of the free layer of the X-axis sensor Y2 to be parallel to the easy-axis and to have the second angle π-Φ (=3π/4) to the first pinned direction, setting the first free magnetization of the free layer of the X-axis sensor Y1 to have the second angle π-Φ (=3π) to the first pinned direction, and pinning the second free magnetization; the X-axis sensor Y2 still serving as the zero-field reference unit. After setting the free magnetizations, the configuration is shown in the fourth period T4 in FIG. 4B. Further perform magnetic field sensing to obtain a fourth difference $$\left(G^{Y1}_{\frac{3\pi}{4}} - G^{Y20}_{\frac{3\pi}{4}}\right)$$

corresponding to conductance difference between the X-axis sensors Y1 and Y2.

Third Embodiment of a Magnetic Field Sensing Method

A magnetic field sensing method according to a third embodiment of the disclosure comprises: providing a fixed or direct-current bias signal to the Z-axis sensors Z1~Z2; in a first period to a fourth period (T1~T4), respectively performing a first, second, third and fourth sensing operation to respectively set configurations of the free magnetizations of the Z-axis sensors Z1~Z2 and obtain a first, second, third and fourth difference corresponding to the conductance differences between the Z-axis sensors Z1 and Z2; and summing the first to fourth differences to obtain a sensing value corresponding to magnetic field intensity.

The first to fourth sensing operations of the third embodiment are described by referencing the free magnetization configurations of the Z-axis sensors depicted in FIG. 4A.

Referring to FIG. 3, the Z-axis sensor Z1 comprises the MTJ devices L1 and R1 connected in parallel, and the Z-axis sensor Z2 comprises the MTJ devices L2 and R2 connected in parallel. Therefore, the free magnetizations of the MTJ devices L1~L2 and the MTJ devices R1~R2 are configured to set the free magnetization configurations of the Z-axis sensors Z1 and Z2.

In the first period T1, the first sensing operation comprises: setting a first free magnetization of the free layer of the MTJ device R1 to be parallel to the easy-axis of the MTJ device R1 and to have a first angle Φ to a first pinned direction (pinned magnetization), setting a second free magnetization of the free layer of the MTJ device R2 to be parallel to the easy-axis of the MTJ device R2 and to have a second angle π-Φ to the first pinned direction, setting a third free magnetization of the free layer of the MTJ device L1 to be parallel to the easy-axis of the MTJ device L1 and to have the first angle Φ to a second pinned direction, and setting a fourth free magnetization of the free layer of the MTJ device L2 to be parallel to the easy-axis of the MTJ device L2 and to have the second angle π-Φ to the second pinned direction. In addition, the first and third free magnetizations of the first and third MTJ device R1 and L1 are pinned and thus the Z-axis sensor Z1 serves as a zero-field reference unit. It is noted that the easy-axes of the first to fourth MTJ devices are parallel, and the first and second pinned directions are symmetrical to one of the easy-axes of the first to fourth MTJ devices. Further perform magnetic field sensing to obtain a first difference corresponding to conductance difference between the Z-axis sensors Z2 and Z1.

In the second period T2, the second sensing operation comprises: setting the first free magnetization of the free layer of the MTJ device R1 to be parallel to the easy-axis of the MTJ device R1 and to have the second angle π-Φ to a first pinned direction (pinned magnetization), setting the second free magnetization of the free layer of the MTJ device R2 to be parallel to the easy-axis of the MTJ device R2 and to have the first angle Φ to the first pinned direction, setting the third free magnetization of the free layer of the MTJ device L1 to be parallel to the easy-axis of the MTJ device L1 and to have the second angle π-Φ to the second pinned direction, and setting the fourth free magnetization of the free layer of the MTJ device L2 to be parallel to the easy-axis of the MTJ device L2 and to have the first angle Φ to the second pinned direction. In addition, the first and third free magnetizations of the first and third MTJ device R1 and L1 are pinned and thus the Z-axis sensor Z1 serves as the zero-field reference unit. Further perform magnetic field sensing to obtain a second difference corresponding to conductance difference between the Z-axis sensors Z2 and Z1.

In the third period T3, the third sensing operation comprises: setting the first free magnetization of the free layer of the MTJ device R1 to be parallel to the easy-axis of the MTJ device R1 and to have the second angle π-Φ to a first pinned direction (pinned magnetization), setting the second free magnetization of the free layer of the MTJ device R2 to be parallel to the easy-axis of the MTJ device R2 and to have the first angle Φ to the first pinned direction, setting the third free magnetization of the free layer of the MTJ device L1 to be parallel to the easy-axis of the MTJ device L1 and to have the second angle π-Φ to the second pinned direction, and setting the fourth free magnetization of the free layer of the MTJ device L2 to be parallel to the easy-axis of the MTJ device L2 and to have the first angle Φ to the second pinned direction. In addition, the second and fourth free magnetizations of the second and fourth MTJ device R2 and L2 are pinned and thus the Z-axis sensor Z2 serves as the zero-field reference unit. Further perform magnetic field sensing to obtain a third difference corresponding to conductance difference between the Z-axis sensors Z1 and Z2.

In the fourth period T4, the fourth sensing operation comprises: setting the first free magnetization of the free layer of the MTJ device R1 to be parallel to the easy-axis of the MTJ device R1 and to have the first angle Φ to a first pinned direction (pinned magnetization), setting the second free magnetization of the free layer of the MTJ device R2 to be parallel to the easy-axis of the MTJ device R2 and to have the second angle π-Φ to the first pinned direction, setting the third free magnetization of the free layer of the MTJ device L1 to be parallel to the easy-axis of the MTJ device L1 and to have the first angle Φ to the second pinned direction, and setting the fourth free magnetization of the free layer of the MTJ device L2 to be parallel to the easy-axis of the MTJ device L2 and to have the second angle π-Φ to the second pinned direction. In addition, the second and fourth free magnetizations of the second and fourth MTJ device R2 and L2 are pinned and thus the Z-axis sensor Z2 serves as the zero-field reference unit. Further perform magnetic field sensing to obtain a fourth difference corresponding to conductance difference between the Z-axis sensors Z1 and Z2.

In addition, a magnetic field sensing method according to a fourth embodiment of the disclosure, by and large, comprises similar steps with that of the third embodiment. The differences between the fourth and third embodiments are in the first to fourth sensing operations respectively performed in the first to fourth periods T1~T4. The first to fourth sensing operations of the fourth embodiment will be described as follows.

Fourth Embodiment of a Magnetic Field Sensing Method

The first to fourth sensing operations of the fourth embodiment are described by referencing the free magnetization configurations of the Z-axis sensors depicted in FIG. 4B.

In the first period T1, the first sensing operation comprises: setting a first free magnetization of the free layer of the MTJ device R1 to be parallel to the easy-axis of the MTJ device R1 and to have a first angle Φ to a first pinned direction (pinned magnetization), setting a second free magnetization of the free layer of the MTJ device R2 to be parallel to the easy-axis of the MTJ device R2 and to have the first angle Φ to the first pinned direction, setting a third free magnetization of the free layer of the MTJ device L1 to be parallel to the easy-axis of the MTJ device L1 and to have the first angle Φ to a second pinned direction, and setting a fourth free magnetization of the free layer of the MTJ device L2 to be parallel to the easy-axis of the MTJ device L2 and to have the first angle Φ to the second pinned direction. In addition, the first and third free magnetizations of the first and third MTJ device R1 and L1 are pinned and thus the Z-axis sensor Z1 serves as a zero-field reference unit. It is noted that the easy-axes of the first to fourth MTJ devices are parallel, and the first and second pinned directions are symmetrical to one of the easy-axes of the first to fourth MTJ devices. Further perform magnetic field sensing to obtain a first difference corresponding to conductance difference between the Z-axis sensors Z2 and Z1.

In the second period T2, the second sensing operation comprises: setting the first free magnetization of the free layer of the MTJ device R1 to be parallel to the easy-axis of the MTJ device R1 and to have the second angle π-Φ to a first pinned direction (pinned magnetization), setting the second free magnetization of the free layer of the MTJ device R2 to be parallel to the easy-axis of the MTJ device R2 and to have the second angle π-Φ to the first pinned direction, setting the third free magnetization of the free layer of the MTJ device L1 to be parallel to the easy-axis of the MTJ device L1 and to have the second angle π-Φ to the second pinned direction, and setting the fourth free magnetization of the free layer of the MTJ device L2 to be parallel to the easy-axis of the MTJ device L2 and to have the second angle π-Φ to the second pinned direction. In addition, the first and third free magnetizations of the first and third MTJ device R1 and L1 are pinned and thus the Z-axis sensor Z1 serves as the zero-field reference unit. Further perform magnetic field sensing to obtain a second difference corresponding to conductance difference between the Z-axis sensors Z2 and Z1.

In the third period T3, the third sensing operation comprises: setting the first free magnetization of the free layer of the MTJ device R1 to be parallel to the easy-axis of the MTJ device R1 and to have the first angle π-Φ to a first pinned direction (pinned magnetization), setting the second free magnetization of the free layer of the MTJ device R2 to be parallel to the easy-axis of the MTJ device R2 and to have the first angle Φ to the first pinned direction, setting the third free magnetization of the free layer of the MTJ device L1 to be parallel to the easy-axis of the MTJ device L1 and to have the first angle Φ to the second pinned direction, and setting the fourth free magnetization of the free layer of the MTJ device L2 to be parallel to the easy-axis of the MTJ device L2 and to have the first angle Φ to the second pinned direction. In addition, the second and fourth free magnetizations of the second and fourth MTJ device R2 and L2 are pinned and thus the Z-axis sensor Z2 serves as the zero-field reference unit. Further perform magnetic field sensing to obtain a third difference corresponding to conductance difference between the Z-axis sensors Z1 and Z2.

In the fourth period T4, the fourth sensing operation comprises: setting the first free magnetization of the free layer of the MTJ device R1 to be parallel to the easy-axis of the MTJ device R1 and to have the second angle π-Φ to a first pinned direction (pinned magnetization), setting the second free magnetization of the free layer of the MTJ device R2 to be parallel to the easy-axis of the MTJ device R2 and to have the second angle π-Φ to the first pinned direction, setting the third free magnetization of the free layer of the MTJ device L1 to be parallel to the easy-axis of the MTJ device L1 and to have the second angle π-Φ to the second pinned direction, and setting the fourth free magnetization of the free layer of the MTJ device L2 to be parallel to the easy-axis of the MTJ device L2 and to have the second angle π-Φ to the second pinned direction. In addition, the second and fourth free magnetizations of the second and fourth MTJ device R2 and L2 are pinned and thus the Z-axis sensor Z2 serves as the zero-field reference unit. Further perform magnetic field sensing to obtain a fourth difference corresponding to conductance difference between the Z-axis sensors Z1 and Z2.

The summing results of the first to fourth differences in the first to fourth embodiments can response the magnetic field intensity under sensing.

Figure 5A:
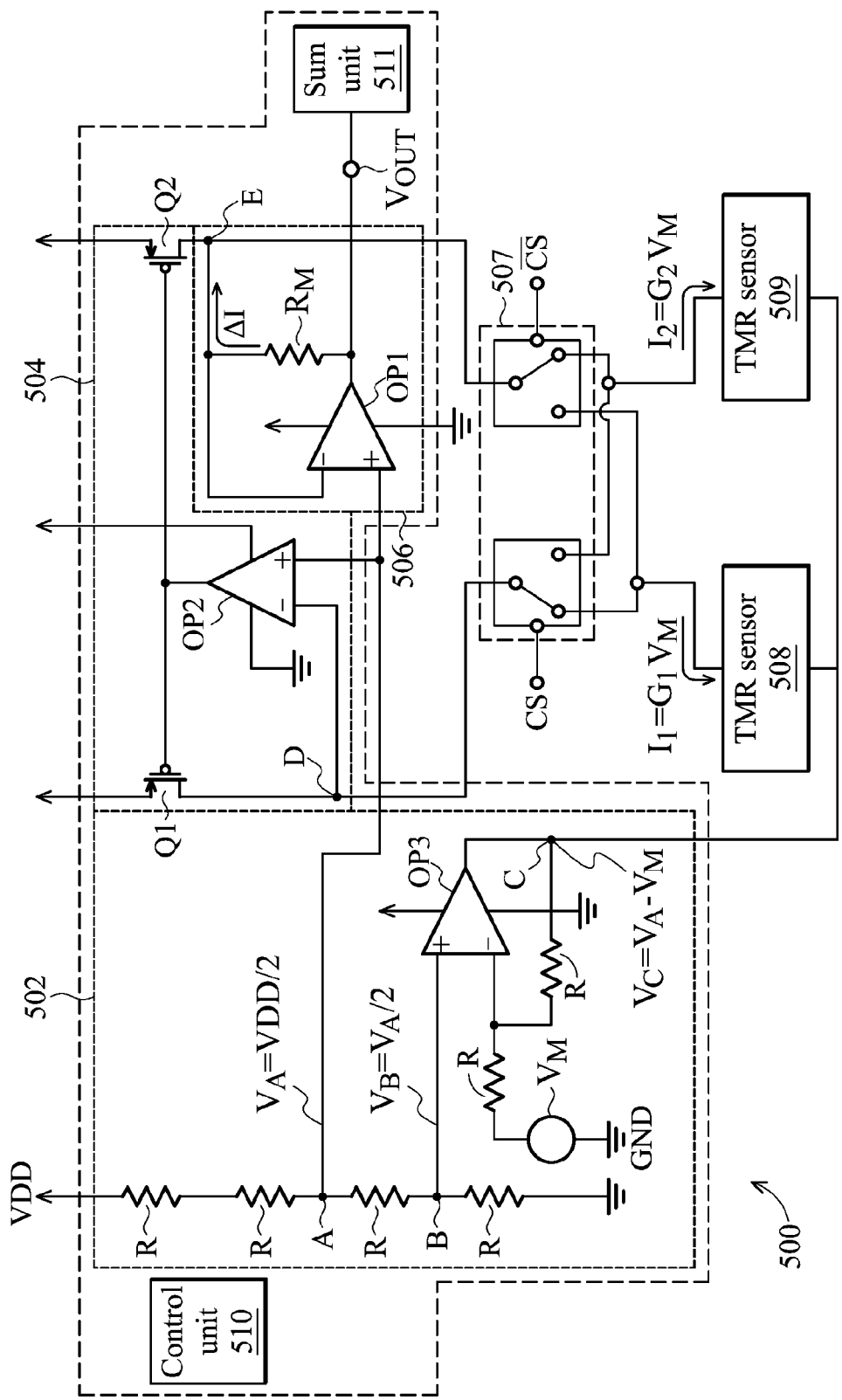
FIGS. 5A and 5B show embodiments of magnetic field sensing apparatus according to the disclosure.
Figure 5B:
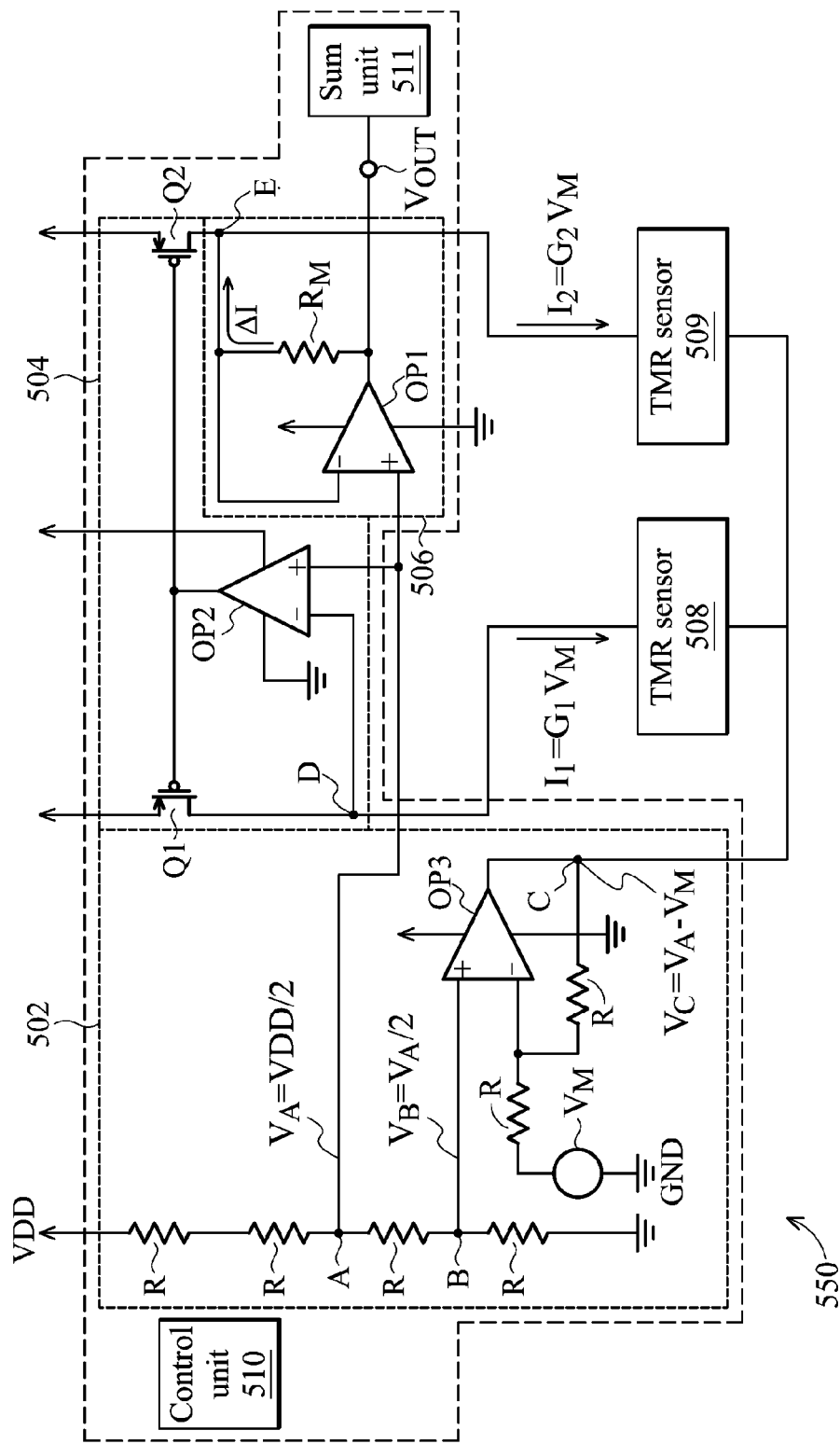

Using Y-axis sensors X1 and Y2 for magnetic field sensing and applying the method of the first embodiment, the free magnetization configurations of the Y-axis sensors Y1~Y2, in the first to fourth periods T1~T4, are depicted as the Y-axis sensors with respect to the first to fourth periods T1~T4 in FIG. 4A. Using Y-axis sensors X1 and Y2 for magnetic field sensing and applying the method of the second embodiment, the free magnetization configurations of the Y-axis sensors Y1~Y2, in the first to fourth periods T1~T4, are depicted as the Y-axis sensors with respect to the first to fourth periods T1~T4 in FIG. 4B Embodiments of Magnetic Field Sensing Apparatus FIGS. 5A and 5B show two embodiments of magnetic field sensing apparatus according to the disclosure. Referring to FIG. 5A, the magnetic field sensing apparatus 500 comprises: a bias unit 502, a voltage-clamping current mirror unit 504, a transform unit 506, a switch unit 507, a control unit, a sum unit and two TMR sensors 508~509. The magnetic field sensing apparatus 550 comprises, by and large, same components in FIG. 5A, except the switch unit 507.

The bias unit comprises a voltage divider, a voltage subtractor and a constant voltage source $V_M$. Here, the voltage divider comprises four same resistors R connected in series between a voltage source VDD and a reference ground GND, setting voltages at a node A and a node B to respectively have voltage levels of $V_A$ (=VDD/2) and $V_B$ (=$V_A$/2=VDD/2). The voltage subtractor comprises an operational amplifier OP3 and tow same resistors R, a positive and negative input terminals of the operational amplifier OP3 respectively coupled to the node B and the constant voltage source $V_M$, an output terminal of the operational amplifier OP3 connected to a node C for outputting voltage $V_C$ (=$V_A$-$V_M$) to the TMR sensors 508 and 509.

The voltage-clamping current mirror unit 504 comprises a current mirror constructed by a first PMOS transistor Q1 and a second PMOS transistor Q2, and a voltage damper. The first and second PMOS transistors Q1 and Q2 are of same size, having sources connected to voltage VDD and drains respectively connected to a node D and a node E. The node D and E respectively serve as a first and second output terminal of the voltage-clamping current mirror unit 504. Gates of the first and second PMOS transistors Q1~Q2 are connected together. The voltage damper is made of an operational amplifier OP2, having a positive input terminal connected to the node A to receive the voltage $V_A$ (=VDD/2), a negative input terminal connected to the node D and an output terminal connected to the gates of the first and second PMOS transistors Q1~Q2.

The transform unit 506 comprises an operational amplifier OP1 and a sensing resistor $R_M$. The operational amplifier OP1 has a positive input terminal connected to the node A to receive the voltage $V_A$ and a negative input terminal connected to the node E. The sensing resistor $R_M$ is connected to the negative input terminal and an output terminal of the operational amplifier OP1.

The switch unit 507 is provided between the voltage-clamping current mirror unit 504 and the two TMR sensors 508~509, selecting the connections of the nodes D, E and the TMR sensors 508, 509 according to switch signals CS and $\overline{CS}$ which are complement signals. When the switch signal CS is of High logic level, the switch unit 507 respectively connects the nodes D and E to the TMR sensors 508 and 509, and when the switch signal CS is of Low logic level, the switch unit 507 respectively connects the nodes D and E to the TMR sensors 509 and 508. It is noted that when the switch signal CS is of High logic level, the magnetic field sensing apparatus 500 in FIG. 5A is equivalent to the magnetic field sensing apparatus 550 in FIG. 5B.

The TMR sensors 508 and 509 may be the X-axis sensors (Y1, Y2), the Y-axis sensors (X1, X2) and the Z-axis sensors (Z1, Z2) in FIG. 3.

The operational amplifiers OP1~OP3 are powered by the voltage source VDD. The output terminal of the operational amplifier OP2 feeds back to the negative input terminal of the operational amplifier OP2 through the first PMOS transistor Q1, and the output terminal of the operational amplifier OP1 feeds back to the negative input terminal of the operational amplifier OP1 through the resistor $R_M$. Therefore, the positive and negative input terminals of the operational amplifiers OP1 and OP2 are virtually short such that the voltage difference between the operational amplifiers OP1 and OP2 is zero, thereby clamping a voltage $V_D$ of the node D and a voltage $V_E$ of the node E to the voltage $V_A$ (=VDD/2) of the node A. Such design makes the output ($V_{OUT}$) of the transform unit 506 output the voltage $V_A$ (=VDD/2). The TMR sensors 508 and 509 are applied to a working voltage $V_M$ (=$V_D$-$V_C$). The transform unit 506 outputs Vout=VDD/2+$\Delta G \times V_M \times R_M$ when it operates to sense magnetic field, where $\Delta G$ is the conductance difference between the TMR sensors 509 and 508.

The control unit 510, in a first to fourth period (T1~T4), respectively sets angle configurations of a first free magnetization of the free layer of the TMR sensor 508 (corresponding to the X-axis sensor Y1 or the Y-axis sensor X1 in FIG. 3) and a second free magnetization of the free layer of the TMR sensor 509 (corresponding to the X-axis sensor Y2 or the Y-axis sensor X2 in FIG. 3) with respect to a first pinned direction. The detailed free magnetization configurations are depicted in FIGS. 4A and 4B. The control unit 510 sets the TMR sensors 508 and 509 the angle configurations, for example, by driving a setting device (not shown in FIGS. 5A and 5B) to provide setting currents to the metal line paths SL11~SL12, SL21~SL22 or SL31~SL32 FIG. 3 for setting the free magnetizations.

The control unit 510 uses the magnetic field sensing method of the first embodiment, in the first to fourth period T1~T4, setting the angle configurations of the free magnetizations of the X-axis sensors Y1~Y2, the Y-axis sensors X1~X2 or the Z-axis sensors Z1~Z2, and the setting result is shown as the angle configurations of the free magnetizations of the X-axis, Y-axis and Z-axis sensors in FIG. 4A. The control unit 510 uses the magnetic field sensing method of the second embodiment, in the first to fourth period T1~T4, setting the angle configurations of the free magnetizations of the X-axis sensors Y1~Y2, the Y-axis sensors X1~X2 or the Z-axis sensors Z1~Z2, and the setting result is shown as the angle configurations of the free magnetizations of the X-axis, Y-axis and Z-axis sensors in FIG. 4B.

Referring to FIGS. 4A and 4B, the control unit 510, in the first to fourth period T1~T4, makes the TMR sensor 508 (Y1, X1 or Z1) as a zero-field reference unit which has conductance not responding to external magnetic field, and makes the TMR sensor 509 as (X2, Y2, or Z2) as a TMR magnetic field sensing unit.

In the magnetic field sensing apparatus 500 in FIG. 5A, in the first and second periods T1~T2, when the switch unit 507 receives the switch signal CS of High logic level, a current $I_2$ (=$G_2 V_M$) flowing through the TMR sensor 509 equals the sum of a current $I_1$ (=$G_1 V_M$) flowing through the TMR sensor 508 and a sensed current $\Delta I$ resulting from conductance variation responding to the magnetic field. In the first and second period T1~T2, the sensed current $\Delta I$ equals $I_2-I_1$=($G_2-G_1$) VM, where $G_1$ and $G_2$ are the conductance of the first and second TMR sensors 508 and 509 respectively. In the third and fourth periods T3~T4, when the switch unit 507 receives the switch signal CS of Low logic level, the current $I_1$ (=$G_1 V_M$) flowing through the TMR sensor 508 equals the sum of the current $I_2$ (=$G_2 V_M$) flowing through the TMR sensor 509 and the sensed current $\Delta I$ resulting from conductance variation responding to the magnetic field. In the third and fourth period T3~T4, the sensed current $\Delta I$ equals $I_1-I_2$= ($G_1-G_2$)$V_M$. The switch unit 507 disappears in the magnetic field apparatus 550 in FIG. 5B, and therefore the sensed current ΔI equals $I_2-I_1=(G_2-G_1)V_M$ in the first to fourth period.

For the magnetic field sensing apparatus 500 in FIG. 5A, in the first to fourth period T1~T4, the sensed current ΔI equals a subtraction of the current of the zero-field reference unit from that of the TMR sensing unit. For the magnetic field sensing apparatus 550 in FIG. 5B, in the first to second period T1~T2, the sensed current ΔI equals a subtraction of the current of the zero-field reference unit from that of the TMR sensing unit, and however in the third to fourth period T3~t4, the sensed current ΔI equals a subtraction of the current of the TMR sensing unit from that of the zero-field reference unit.

Based on above descriptions, the control unit 510 of the magnetic field sensing apparatus 500 uses the magnetic field sensing method of the first embodiment, in the first to fourth period T1~T4, and respectively obtains the sensed currents $\Delta I_{T1} \sim \Delta I_{T4}$ as follows (taking the X-axis sensors Y1 and Y2 for example):

$$\Delta I_{T1} = \left(G_{\frac{3\pi}{4}}^{Y2} - G_{\frac{\pi}{4}}^{Y10}\right)V_M;$$

$$\Delta I_{T2} = \left(G_{\frac{\pi}{4}}^{Y2} - G_{\frac{3\pi}{4}}^{Y10}\right)V_M;$$

$$\Delta I_{T3} = \left(G_{\frac{3\pi}{4}}^{Y1} - G_{\frac{\pi}{4}}^{Y20}\right)V_M; \text{ and}$$

$$\Delta I_{T4} = \left(G_{\frac{\pi}{4}}^{Y1} - G_{\frac{3\pi}{4}}^{Y20}\right)V_M.$$

Based on above descriptions, the control unit 510 of the magnetic field sensing apparatus 550 uses the magnetic field sensing method of the first embodiment, in the first to fourth period T1~T4, and respectively obtains the sensed currents $\Delta I_{T1} \Delta I_{T4}$ as follows (taking the X-axis sensors Y1 and Y2 for example):

$$\Delta I_{T1} = \left(G_{\frac{3\pi}{4}}^{Y2} - G_{\frac{\pi}{4}}^{Y10}\right)V_M;$$

$$\Delta I_{T2} = \left(G_{\frac{\pi}{4}}^{Y2} - G_{\frac{3\pi}{4}}^{Y10}\right)V_M;$$

$$\Delta I_{T3} = -\left(G_{\frac{3\pi}{4}}^{Y1} - G_{\frac{\pi}{4}}^{Y20}\right)V_M; \text{ and}$$

$$\Delta I_{T4} = -\left(G_{\frac{\pi}{4}}^{Y1} - G_{\frac{3\pi}{4}}^{Y20}\right)V_M.$$

In addition, based on above descriptions, the control unit 510 of the magnetic field sensing apparatus 500 uses the magnetic field sensing method of the second embodiment, in the first to fourth period T1~T4, and respectively obtains the sensed currents $\Delta I_{T1} \sim \Delta I_{T4}$ as follows (taking the X-axis sensors Y1 and Y2 for example):

$$\Delta I_{T1} = \left(G_{\frac{\pi}{4}}^{Y2} - G_{\frac{\pi}{4}}^{Y10}\right)V_M;$$

$$\Delta I_{T2} = \left(G_{\frac{3\pi}{4}}^{Y2} - G_{\frac{3\pi}{4}}^{Y10}\right)V_M;$$

$$\Delta I_{T3} = \left(G_{\frac{\pi}{4}}^{Y1} - G_{\frac{\pi}{4}}^{Y20}\right)V_M; \text{ and}$$

$$\Delta I_{T4} = \left(G_{\frac{3\pi}{4}}^{Y1} - G_{\frac{3\pi}{4}}^{Y20}\right)V_M.$$

Based on above descriptions, the control unit 510 of the magnetic field sensing apparatus 550 uses the magnetic field sensing method of the second embodiment, in the first to fourth period T1~T4, and respectively obtains the sensed currents $\Delta I_{T1} \Delta I_{T4}$ as follows (taking the X-axis sensors Y1 and Y2 for example):

$$\Delta I_{T1} = \left(G_{\frac{\pi}{4}}^{Y2} - G_{\frac{\pi}{4}}^{Y10}\right)V_M;$$

$$\Delta I_{T2} = \left(G_{\frac{3\pi}{4}}^{Y2} - G_{\frac{3\pi}{4}}^{Y10}\right)V_M;$$

$$\Delta I_{T3} = -\left(G_{\frac{\pi}{4}}^{Y1} - G_{\frac{\pi}{4}}^{Y20}\right)V_M; \text{ and}$$

$$\Delta I_{T4} = -\left(G_{\frac{3\pi}{4}}^{Y1} - G_{\frac{3\pi}{4}}^{Y20}\right)V_M.$$

Each of the transform units 506 of the magnetic field sensing apparatus 500 and 550, in the first to fourth period T1~T4, respectively outputs voltages $V_{OUT\_T1} \sim V_{OUT\_T4}$ corresponding to the sensed currents $\Delta I_{T1} \sim \Delta I_{T4}$ to the sum unit 511. The sum unit 511 of the magnetic field sensing apparatus 500 directly sums the ingredients corresponding to the sensed currents $\Delta I_{T1} \sim \Delta I_{T4}$ in the voltages $V_{OUT\_T1} \sim V_{OUT\_T4}$, thereby obtaining the summing result $\Delta I_{T1}+\Delta I_{T2}+\Delta I_{T3}+\Delta I_{T4}$ corresponding to the magnetic field sensing value $\Delta G^{Y1}+\Delta G^{Y2}$ in the equations (7) and (8).

The sum unit 511 of the magnetic field sensing apparatus 550 further changes the polarity of the ingredients corresponding to the sensed currents $\Delta I_{T3}$ and $\Delta I_{T4}$ in the voltages $V_{OUT\_T3}$ and $V_{OUT\_T4}$ and directly sums the ingredients corresponding to the sensed currents $\Delta I_{T1} \sim \Delta I_{T4}$ in the voltages $V_{OUT\_T1} \sim V_{OUT\_T4}$, thereby obtaining the summing result $\Delta I_{T1}+\Delta I_{T2}-\Delta I_{T3}-\Delta I_{T4}$ corresponding to the magnetic field sensing value $\Delta G^{Y1}+\Delta G^{Y2}$ in the equations (7) and (8).

The Y-axis sensor and the X-axis sensor have similar way for sensing magnetic field. When use the Y-axis sensors X1 and X2, each of the transform units 506 of the magnetic field sensing apparatuses 500 and 550, in the first to fourth period T1~T4, respectively outputs voltages $V'_{OUT\_T1} \sim V'_{OUT\_T4}$ corresponding to the sensed currents $\Delta I'_{T1} \sim \Delta I'_{T4}$ to the sum unit 511. The sum unit 511 of the magnetic field sensing apparatus 500 directly sums the ingredients corresponding to the sensed currents $\Delta I'_{T1} \sim \Delta I'_{T4}$ in the voltages $V'_{OUT\_T1} \sim V'_{OUT\_T4}$, thereby obtaining the summing result $\Delta I_{T1}+\Delta I_{T2}+\Delta I_{T3}+\Delta I_{T4}$ corresponding to the magnetic field sensing value $\Delta G^{X1}+\Delta G^{X2}$.

The sum unit 511 of the magnetic field sensing apparatus 550 further changes the polarity of the ingredients corresponding to the sensed currents $\Delta I'_{T1}$ and $\Delta I'_{T4}$ in the voltages $V'_{OUT\_T3}$ and $V'_{OUT\_T4}$ and directly sums the ingredients corresponding to the sensed currents $\Delta I_{T1} \sim \Delta I_{T4}$ in the voltages $V'_{OUT\_T1} \sim V'_{OUT\_T4}$, thereby obtaining the summing result $\Delta I'_{T1}+\Delta I'_{T2}-\Delta I'_{T3}-\Delta I'_{T4}$ corresponding to the magnetic field sensing value $\Delta G^{X1}+\Delta G^{X2}$.

In the same way, when use the Z-axis sensors Z1 and Z2, the control unit 510 of the magnetic field sensing apparatus 550 uses the magnetic field sensing method of the third and fourth embodiments, in the first to fourth period T1~T4, and respectively obtains the sensed currents $\Delta I''_{T1} \sim \Delta I''_{T4}$. Each of the transform units 506 of the magnetic field sensing apparatuses 500 and 550, in the first to fourth period T1~T4, respectively outputs voltages $V''OUT_{T1} \sim V''_{OUT\_T4}$ corresponding to the sensed currents $\Delta I''_{T1} \sim \Delta I''_{T4}$ to the sum unit 511. The sum unit 511 of the magnetic field sensing apparatus 500 directly sums the ingredients corresponding to the sensed currents $\Delta I''_{T1} \sim \Delta I''_{T4}$ in the voltages $V''_{OUT\_T1} \sim V''_{OUT\_T4}$, thereby obtaining the summing result $\Delta I''_{T1} + \Delta I''_{T2} + \Delta I''_{T3} + \Delta I''_{T4}$ corresponding to the magnetic field sensing value $\Delta G^{Z1} + \Delta G^{Z2}$.

The sum unit 511 of the magnetic field sensing apparatus 550 further changes the polarity of the ingredients corresponding to the sensed currents $\Delta I''_{T1}$ and $\Delta I''_{T4}$ in the voltages $V''_{OUT\_T3}$ and $V''_{OUT\_T4}$ and directly sums the ingredients corresponding to the sensed currents $\Delta I''_{T1} \sim \Delta I''_{T4}$ in the voltages $V''_{OUT\_T1} \sim V''_{OUT\_T4}$, thereby obtaining the summing result $\Delta I''_{T1} + \Delta I''_{T2} - \Delta I''_{T3} - \Delta I''_{T4}$ corresponding to the magnetic field sensing value $\Delta G^{X1} + \Delta G^{X2}$.

Every X-axis sensor having two MTJ devices, every Y-axis sensors having two MTJ devices and every Z-axis sensors having four MTJ devices may be applied to the magnetic field sensing apparatus implemented according the magnetic field sensing method of the disclosure. Comparing to the Taiwan Patent Application serial number 100123328, the magnetic field sensing apparatus of the disclosure can use fewer devices for cost down. The MTJ devices or TMR sensors are compatible with general semiconductor fabrication process and easily to be integrated, thereby increasing the yield rate and reliability of the magnetic field sensing apparatus.

It will be apparent to those skilled in the art that various modifications and variations can be made to the disclosed methods and materials. It is intended that the specification and examples be considered as exemplary only, with a true scope of the disclosure being indicated by the following claims and their equivalents.

What is claimed is:

1. A magnetic field sensing method using tunneling magneto-resistor (TMR) sensors, comprising:

using a first TMR sensor and a second TMR sensor for sensing magnetic field; wherein the first TMR sensor and the second TMR sensor respectively comprise a first magnetic tunneling junction (MTJ) device and a second MTJ device, the first MTJ device and the second MTJ device having a pinned layer, a tunneling layer and a free layer, the pinned layers of the first and second MTJ device having a pinned magnetization at a first pinned direction and the first pinned direction having a first angle $\Phi$ to an easy-axis;

providing a bias signal to the first and second TMR sensor;

in a first period, performing a first sensing operation, comprising:

setting a first free magnetization of the free layer of the first MTJ device to be parallel to the easy-axis and to have the first angle $\Phi$ to the first pinned direction, setting a second free magnetization of the free layer of the second MTJ device to have a second angle $\pi$-$\Phi$ to the first pinned direction, and pinning the first free magnetization; and performing magnetic field sensing to obtain a first difference corresponding to conductance difference between the second TMR sensor and the first TMR sensor;

in a second period, performing a second sensing operation, comprising:

setting the first free magnetization of the free layer of the first MTJ device to be parallel to the easy-axis and to have the second angle $\pi$-$\Phi$ to the first pinned direction, setting the second free magnetization of the free layer of the second MTJ device to have the first angle $\Phi$ to the first pinned direction, and pinning the first free magnetization; and performing magnetic field sensing to obtain a second difference corresponding to conductance difference between the second TMR sensor and the first TMR sensor;

in a third period, performing a third sensing operation, comprising:

setting the second free magnetization of the free layer of the second MTJ device to be parallel to the easy-axis and to have the first angle $\Phi$ to the first pinned direction, setting the first free magnetization of the free layer of the second MTJ device to have the second angle $\pi$-$\Phi$ to the first pinned direction, and pinning the second free magnetization; and performing magnetic field sensing to obtain a third difference corresponding to conductance difference between the first TMR sensor and the second TMR sensor;

in a fourth period, performing a fourth sensing operation, comprising:

setting the second free magnetization of the free layer of the second MTJ device to be parallel to the easy-axis and to have the second angle $\pi$-$\Phi$ to the first pinned direction, setting the first free magnetization of the free layer of the first MTJ device to have the first angle $\Phi$ to the first pinned direction, and pinning the second free magnetization; and performing magnetic field sensing to obtain a fourth difference corresponding to conductance difference between the first TMR sensor and the second TMR sensor;

summing the first to fourth differences to obtain a sensing value corresponding to magnetic field intensity.

2. The magnetic field sensing method as claimed in claim 1, wherein the first TMR sensor and the second TMR sensor further respectively comprise a third magnetic tunneling junction (MTJ) device and a fourth MTJ device, the third MTJ device and the fourth MTJ device having a pinned layer, a tunneling layer and a free layer, the pinned layers of the third and fourth MTJ device having a pinned magnetization at a second pinned direction, the second and first pinned direction being symmetrical to the easy-axis and the second pinned direction having the first angle $\Phi$ to the easy-axis; and the third and fourth MTJ device respectively connected in parallel to the first and second MTJ device;

the first sensing operation further comprising: setting a third free magnetization of the free layer of the third MTJ device to be parallel to the easy-axis and to have the first angle $\Phi$ to the second pinned direction, setting a fourth free magnetization of the free layer of the fourth MTJ device to have the second angle $\pi$-$\Phi$ to the second pinned direction, and pinning the third free magnetization;

the second sensing operation further comprising: setting the third free magnetization of the free layer of the third MTJ device to be parallel to the easy-axis and to have the second angle $\pi$-$\Phi$ to the second pinned direction, setting the fourth free magnetization of the free layer of the fourth MTJ device to have the first angle $\Phi$ to the second pinned direction, and pinning the third free magnetization;

the third sensing operation further comprising: setting the fourth free magnetization of the free layer of the fourth MTJ device to be parallel to the easy-axis and to have the first angle $\Phi$ to the second pinned direction, setting the third free magnetization of the free layer of the third MTJ device to have the second angle $\pi$-$\Phi$ to the second pinned direction, and pinning the fourth free magnetization;

the fourth sensing operation further comprising: setting the fourth free magnetization of the free layer of the fourth MTJ device to be parallel to the easy-axis and to have the second angle $\pi$-$\Phi$ to the second pinned direction, setting the third free magnetization of the free layer of the third MTJ device to have the first angle Φ to the second pinned direction, and pinning the fourth free magnetization.

3. The magnetic field sensing method as claimed in claim 2, wherein the first TMR sensor and the second TMR sensor respective have a convex or concave structure formed a substrate, the convex or concave structure having a first inclined plane and a second inclined plane which have same inclined angle to the substrate and are symmetrically flipped with respect to a central axis of the convex or concave structure; and wherein the first and second MTJ devices are provided on the first inclined plane and the third and fourth MTJ devices are provided on the second inclined plane.

4. The magnetic field sensing method as claimed in claim 1, wherein each of the first to fourth difference is obtained by getting difference of currents in the first and second TMR sensor.

5. A magnetic field sensing method using tunneling magneto-resistor (TMR) sensors, comprising:

using a first TMR sensor and a second TMR sensor for sensing magnetic field; wherein the first TMR sensor and the second TMR sensor respectively comprise a first magnetic tunneling junction (MTJ) device and a second MTJ device, the first MTJ device and the second MTJ device respectively having a pinned layer, a tunneling layer and a free layer, the pinned layers of the first and second MTJ device having a pinned magnetization at a first pinned direction and the first pinned direction having a first angle Φ to an easy-axis;

providing a bias signal to the first and second TMR sensor;

in a first period, performing a first sensing operation, comprising:

setting a first free magnetization of the free layer of the first MTJ device to be parallel to the easy-axis and to have the first angle Φ to the first pinned direction, setting a second free magnetization of the free layer of the second MTJ device to have the first angle Φ to the first pinned direction, and pinning the first free magnetization; and performing magnetic field sensing to obtain a first difference corresponding to conductance difference between the second TMR sensor and the first TMR sensor;

in a second period, performing a second sensing operation, comprising:

setting the first free magnetization of the free layer of the first MTJ device to be parallel to the easy-axis and to have a second angle π-Φ to the first pinned direction, setting the second free magnetization of the free layer of the second MTJ device to have the second angle π-Φ to the first pinned direction, and pinning the first free magnetization; and performing magnetic field sensing to obtain a second difference corresponding to conductance difference between the second TMR sensor and the first TMR sensor;

in a third period, performing a third sensing operation, comprising:

setting the second free magnetization of the free layer of the second MTJ device to be parallel to the easy-axis and to have the first angle Φ to the first pinned direction, setting the first free magnetization of the free layer of the first MTJ device to have the first angle Φ to the first pinned direction, and pinning the second free magnetization; and performing magnetic field sensing to obtain a third difference corresponding to conductance difference between the first TMR sensor and the second TMR sensor;

in a fourth period, performing a fourth sensing operation, comprising:

setting the second free magnetization of the free layer of the second MTJ device to be parallel to the easy-axis and to have the second angle π-Φ to the first pinned direction, setting the first free magnetization of the free layer of the first MTJ device to have the second angle π-Φ to the first pinned direction, and pinning the second free magnetization; and performing magnetic field sensing to obtain a fourth difference corresponding to conductance difference between the first TMR sensor and the second TMR sensor;

summing the first to fourth differences to obtain a sensing result corresponding to magnetic field intensity.

6. The magnetic field sensing method as claimed in claim 5, wherein the first TMR sensor and the second TMR sensor further respectively comprise a third magnetic tunneling junction (MTJ) device and a fourth MTJ device, the third MTJ device and the fourth MTJ device respectively having a pinned layer, a tunneling layer and a free layer, the pinned layers of the third and fourth MTJ device having a pinned magnetization at a second pinned direction, the second and first pinned direction being symmetrical to the easy-axis and the second pinned direction having the first angle Φ to the easy-axis; and the third and fourth MTJ device respectively connected in parallel to the first and second MTJ device;

the first sensing operation further comprising: setting a third free magnetization of the free layer of the third MTJ device to be parallel to the easy-axis and to have the first angle Φ to the second pinned direction, setting a fourth free magnetization of the free layer of the fourth MTJ device to have the first angle Φ to the second pinned direction, and pinning the third free magnetization;

the second sensing operation further comprising: setting the third free magnetization of the free layer of the third MTJ device to be parallel to the easy-axis and to have the second angle π-Φ to the second pinned direction, setting the fourth free magnetization of the free layer of the fourth MTJ device to have the second angle π-Φ to the second pinned direction, and pinning the third free magnetization;

the third sensing operation further comprising: setting the fourth free magnetization of the free layer of the fourth MTJ device to be parallel to the easy-axis and to have the first angle Φ to the second pinned direction, setting the third free magnetization of the free layer of the third MTJ device to have the first angle Φ to the second pinned direction, and pinning the fourth free magnetization;

the fourth sensing operation further comprising: setting the fourth free magnetization of the free layer of the fourth MTJ device to be parallel to the easy-axis and to have the second angle π-Φ to the second pinned direction, setting the third free magnetization of the free layer of the third MTJ device to have the second angle π-Φ to the second pinned direction, and pinning the fourth free magnetization.

7. The magnetic field sensing method as claimed in claim 6, wherein the first TMR sensor and the second TMR sensor respective have a convex or concave structure formed a substrate, the convex or concave structure having a first inclined plane and a second inclined plane which have same inclined angle to the substrate and are symmetrically flipped with respect to a central axis of the convex or concave structure; and wherein the first and second MTJ devices are provided on the first inclined plane and the third and fourth MTJ devices are provided on the second inclined plane.

8. The magnetic field sensing method as claimed in claim 5, wherein each of the first to fourth differences is obtained by getting difference of currents in the first and second TMR sensor.

9. A magnetic field sensing apparatus, comprising:
a voltage-clamping current mirror unit having an input terminal, a first output terminal and a second output terminal, the first and second output terminals respectively providing a first and second fixed voltages of equal level according to a bias voltage received by the input terminal;
a first tunneling magneto-resistor (TMR) sensor and a second TMR sensor directly or indirectly connected to the first output terminal and the second output terminal;
wherein the first TMR sensor and the second TMR sensor respectively comprise a first magnetic tunneling junction (MTJ) device and a second MTJ device, the first MTJ device and the second MTJ device respectively having a pinned layer, a tunneling layer and a free layer, the pinned layers of the first and second MTJ device having a pinned magnetization at a first pinned direction and the first pinned direction having a first angle $\Phi$ to an easy-axis;
a control unit, in a first period to a fourth period, respectively setting angle configurations of a first free magnetization of the free layer of the first MTJ device and a second free magnetization of the free layer of the second MTJ device with respect to the first pinned direction;
a transform unit, in the first period to the fourth period when the magnetic field apparatus senses a magnetic field, respectively transforming a first difference to a fourth difference corresponding to conductance differences between the first TMR sensor and the second TMR sensor to a first electronic signal to a fourth electronic signal; and
a sum unit summing the first to fourth electronic signal to obtain a result electronic signal corresponding to intensity of the magnetic field.

10. The magnetic field sensing apparatus as claimed in claim 9, wherein the control unit
in the first period, setting a first free magnetization of the free layer of the first MTJ device to be parallel to the easy-axis and to have the first angle $\Phi$ to the first pinned direction, setting a second free magnetization of the free layer of the second MTJ device to have a second angle $\pi$-$\Phi$ to the first pinned direction, and pinning the first free magnetization;
in the second period, setting the first free magnetization of the free layer of the first MTJ device to be parallel to the easy-axis and to have the second angle $\pi$-$\Phi$ to the first pinned direction, setting the second free magnetization of the free layer of the second MTJ device to have the first angle $\Phi$ to the first pinned direction, and pinning the first free magnetization;
in the third period, setting the second free magnetization of the free layer of the second MTJ device to be parallel to the easy-axis and to have the first angle $\Phi$ to the first pinned direction, setting the first free magnetization of the free layer of the second MTJ device to have the second angle $\pi$-$\Phi$ to the first pinned direction, and pinning the second free magnetization; and
in the fourth period, setting the second free magnetization of the free layer of the second MTJ device to be parallel to the easy-axis and to have the second angle $\pi$-$\Phi$ to the first pinned direction, setting the first free magnetization of the free layer of the first MTJ device to have the first angle $\Phi$ to the first pinned direction, and pinning the second free magnetization.

11. The magnetic field sensing apparatus as claimed in claim 10, wherein the first TMR sensor and the second TMR sensor further respectively comprise a third magnetic tunneling junction (MTJ) device and a fourth MTJ device, the third MTJ device and the fourth MTJ device having a pinned layer, a tunneling layer and a free layer, the pinned layers of the third and fourth MTJ device having a pinned magnetization at a second pinned direction, the second and first pinned direction being symmetrical to the easy-axis and the second pinned direction having the first angle $\Phi$ to the easy-axis; and the third and fourth MTJ device respectively connected in parallel to the first and second MTJ device;
in the first period, the control unit setting a third free magnetization of the free layer of the third MTJ device to be parallel to the easy-axis and to have the first angle $\Phi$ to the second pinned direction, setting a fourth free magnetization of the free layer of the fourth MTJ device to have the second angle $\pi$-$\Phi$ to the second pinned direction, and pinning the third free magnetization;
in the second period, the control unit setting the third free magnetization of the free layer of the third MTJ device to be parallel to the easy-axis and to have the second angle $\pi$-$\Phi$ to the second pinned direction, setting the fourth free magnetization of the free layer of the fourth MTJ device to have the first angle $\Phi$ to the second pinned direction, and pinning the third free magnetization;
in the third period, the control unit setting the fourth free magnetization of the free layer of the fourth MTJ device to be parallel to the easy-axis and to have the first angle $\Phi$ to the second pinned direction, setting the third free magnetization of the free layer of the third MTJ device to have the second angle $\pi$-$\Phi$ to the second pinned direction, and pinning the fourth free magnetization;
in the fourth period, the control unit setting the fourth free magnetization of the free layer of the fourth MTJ device to be parallel to the easy-axis and to have the second angle $\pi$-$\Phi$ to the second pinned direction, setting the third free magnetization of the free layer of the third MTJ device to have the first angle $\Phi$ to the second pinned direction, and pinning the fourth free magnetization.

12. The magnetic field sensing apparatus as claimed in claim 9, wherein the control unit
in the first period, setting a first free magnetization of the free layer of the first MTJ device to be parallel to the easy-axis and to have the first angle $\Phi$ to the first pinned direction, setting a second free magnetization of the free layer of the second MTJ device to have the first angle $\Phi$ to the first pinned direction, and pinning the first free magnetization; and
in the second period, setting the first free magnetization of the free layer of the first MTJ device to be parallel to the easy-axis and to have a second angle $\pi$-$\Phi$ to the first pinned direction, setting the second free magnetization of the free layer of the second MTJ device to have the second angle $\pi$-$\Phi$ to the first pinned direction, and pinning the first free magnetization; and
in the third period, setting the second free magnetization of the free layer of the second MTJ device to be parallel to the easy-axis and to have the first angle $\Phi$ to the first pinned direction, setting the first free magnetization of the free layer of the second MTJ device to have the first angle $\Phi$ to the first pinned direction, and pinning the second free magnetization; and in the fourth period, setting the second free magnetization of the free layer of the second MTJ device to be parallel to the easy-axis and to have the second angle π-Φ to the first pinned direction, setting the first free magnetization of the free layer of the first MTJ device to have the second angle π-Φ to the first pinned direction, and pinning the second free magnetization.

13. The magnetic field sensing apparatus as claimed in claim 12, wherein the first TMR sensor and the second TMR sensor further respectively comprise a third magnetic tunneling junction (MTJ) device and a fourth MTJ device, the third MTJ device and the fourth MTJ device respectively having a pinned layer, a tunneling layer and a free layer, the pinned layers of the third and fourth MTJ device having a pinned magnetization at a second pinned direction, the second and first pinned direction being symmetrical to the easy-axis and the second pinned direction having the first angle Φ to the easy-axis; and the third and fourth MTJ device respectively connected in parallel to the first and second MTJ device;

in the first period, the control unit setting a third free magnetization of the free layer of the third MTJ device to be parallel to the easy-axis and to have the first angle Φ to the second pinned direction, setting a fourth free magnetization of the free layer of the fourth MTJ device to have the first angle Φ to the second pinned direction, and pinning the third free magnetization;

in the second period, the control unit setting the third free magnetization of the free layer of the third MTJ device to be parallel to the easy-axis and to have the second angle π-Φ to the second pinned direction, setting the fourth free magnetization of the free layer of the fourth MTJ device to have the second angle π-Φ to the second pinned direction, and pinning the third free magnetization;

in the third period, the control unit setting the fourth free magnetization of the free layer of the fourth MTJ device to be parallel to the easy-axis and to have the first angle Φ to the second pinned direction, setting the third free magnetization of the free layer of the third MTJ device to have the first angle Φ to the second pinned direction, and pinning the fourth free magnetization;

in the fourth period, the control unit setting the fourth free magnetization of the free layer of the fourth MTJ device to be parallel to the easy-axis and to have the second angle π-Φ to the second pinned direction, setting the third free magnetization of the free layer of the third MTJ device to have the second angle π-Φ to the second pinned direction, and pinning the fourth free magnetization.

14. The magnetic field sensing apparatus as claimed in claim 11, wherein the first TMR sensor and the second TMR sensor respective have a convex or concave structure formed a substrate, the convex or concave structure having a first inclined plane and a second inclined plane which have same inclined angle to the substrate and are symmetrically flipped with respect to a central axis of the convex or concave structure; and wherein the first and second MTJ devices are provided on the first inclined plane and the third and fourth MTJ devices are provided on the second inclined plane.

15. The magnetic field sensing apparatus as claimed in claim 13, wherein the first TMR sensor and the second TMR sensor respective have a convex or concave structure formed a substrate, the convex or concave structure having a first inclined plane and a second inclined plane which have same inclined angle to the substrate and are symmetrically flipped with respect to a central axis of the convex or concave structure; and wherein the first and second MTJ devices are provided on the first inclined plane and the third and fourth MTJ devices are provided on the second inclined plane.

16. The magnetic field sensing apparatus as claimed in claim 10, further comprising a switch unit connected to the first and second output terminals and the first and second TMR sensors;

in the first and second periods, the switch unit respectively connecting the first and second output terminal to the first and second TMR sensor;

in the third and fourth periods, the switch unit respectively connecting the second and first output terminal to the first and second TMR sensor.

17. The magnetic field sensing apparatus as claimed in claim 12, further comprising a switch unit connected to the first and second output terminals and the first and second TMR sensors;

in the first and second periods, the switch unit respectively connecting the first and second output terminal to the first and second TMR sensor;

in the third and fourth periods, the switch unit respectively connecting the second and first output terminal to the first and second TMR sensor.

18. The magnetic field sensing apparatus as claimed in claim 9, wherein the transform unit comprises an operational amplifier and a resistor, a first input terminal of the operational amplifier receiving the bias voltage, a second input terminal of the operational amplifier connecting the second output terminal of the voltage-clamping current minor unit; the resistor connecting an output terminal and the second input terminal of the operational amplifier; the operational amplifier correspondingly outputting the first to fourth electronic signals in the first to fourth periods.

19. The magnetic field sensing apparatus as claimed in claim 9, wherein the voltage-clamping current mirror comprises:

a first transistor and a second transistor respectively having a first electrode, a second electrode and a control electrode; wherein the first electrodes of the first and second transistors are coupled to a first voltage node, the control electrodes of the first and second transistors are connected together; the second electrodes of the first and second transistors respectively serves as the first and second output terminals of the voltage-clamping minor unit; and a voltage-clamping operational amplifier having a first input terminal receiving the bias voltage, a second input terminal connected to the second electrode of the first transistor, and an output terminal connected to the control electrodes of the first and second transistors.

* * * * *